(12) United States Patent
Ning et al.

(10) Patent No.: US 12,112,819 B2
(45) Date of Patent: Oct. 8, 2024

(54) APPARATUS FOR DETERMINING MEMORY CELL DATA STATES

(71) Applicant: MICRON TECHNOLOGY, INC., Boise, ID (US)

(72) Inventors: Sheyang Ning, San Jose, CA (US); Lawrence Celso Miranda, San Jose, CA (US); Tomoko Ogura Iwasaki, San Jose, CA (US); Ting Luo, San Jose, CA (US); Luyen Vu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/376,198

(22) Filed: Oct. 3, 2023

(65) Prior Publication Data
US 2024/0029809 A1    Jan. 25, 2024

Related U.S. Application Data

(62) Division of application No. 17/681,976, filed on Feb. 28, 2022, now Pat. No. 11,798,647.

(51) Int. Cl.
*G11C 29/42*    (2006.01)
*G11C 7/10*    (2006.01)
(Continued)

(52) U.S. Cl.
CPC ............ *G11C 29/42* (2013.01); *G11C 7/1069* (2013.01); *G11C 7/1096* (2013.01); *G11C 29/12005* (2013.01); *G11C 29/4401* (2013.01)

(58) Field of Classification Search
CPC ..... G11C 29/42; G11C 7/1069; G11C 7/1096; G11C 29/4401
See application file for complete search history.

(56) References Cited

U.S. PATENT DOCUMENTS

| 7,630,240 B2 | 12/2009 | Roohparvar |
| 2009/0019321 A1 | 1/2009 | Radke |

(Continued)

OTHER PUBLICATIONS

Lu, C.C., et al. "Analysis and Realization of TLC or even QLC Operation with High Performance Multi-times Verify Scheme in 3D NAND Flash Memory," IEEE Xplore, 2018, pp. 1-4.

*Primary Examiner* — Han Yang
(74) *Attorney, Agent, or Firm* — Dicke, Billig & Czaja, PLLC

(57) ABSTRACT

Apparatus might include an array of memory cells and a controller for access of the array of memory cells. The controller might be configured to cause the apparatus to apply a sense voltage level to a control gate of a memory cell of the array of memory cells, generate N determinations whether the memory cell is deemed to activate or deactivate while applying the sense voltage level, wherein N is an integer value greater than or equal to three, deem the memory cell to have a threshold voltage in a first range of threshold voltages lower than the sense voltage level in response to a majority of the N determinations indicating activation of the memory cell, and deem the memory cell to have a threshold voltage in a second range of threshold voltages higher than the sense voltage level in response to a majority of the N determinations indicating activation of the memory cell.

20 Claims, 16 Drawing Sheets

(51) Int. Cl.
    *G11C 29/12*     (2006.01)
    *G11C 29/44*     (2006.01)

(56) References Cited

U.S. PATENT DOCUMENTS

2011/0038205 A1     2/2011    Chou et al.
2019/0087264 A1*   3/2019    Tokutomi .......... H03M 13/6505
2020/0301778 A1     9/2020    Kurose et al.

* cited by examiner

APPARATUS FOR DETERMINING MEMORY CELL DATA STATES

RELATED APPLICATION

This application is a Divisional of U.S. application Ser. No. 17/681,976, titled "APPARATUS AND METHODS FOR DETERMINING MEMORY CELL DATA STATES," filed Feb. 28, 2022 (Allowed) which is commonly assigned and incorporated herein by reference.

TECHNICAL FIELD

The present disclosure relates generally to memory and, in particular, in one or more embodiments, the present disclosure relates to apparatus and methods for determining memory cell data states.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of -0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is deemed to be activated in response to a particular voltage applied to its control gate, such as by detecting whether a data line connected to the memory cell experiences a sufficient change in voltage level caused by current flow through the memory cell. As memory operation advances to represent additional data states per memory cell, the margins between adjacent Vt distributions can become smaller. These Vt distributions can further shift and widen over time.

DETAILED DESCRIPTION

Figure 1:
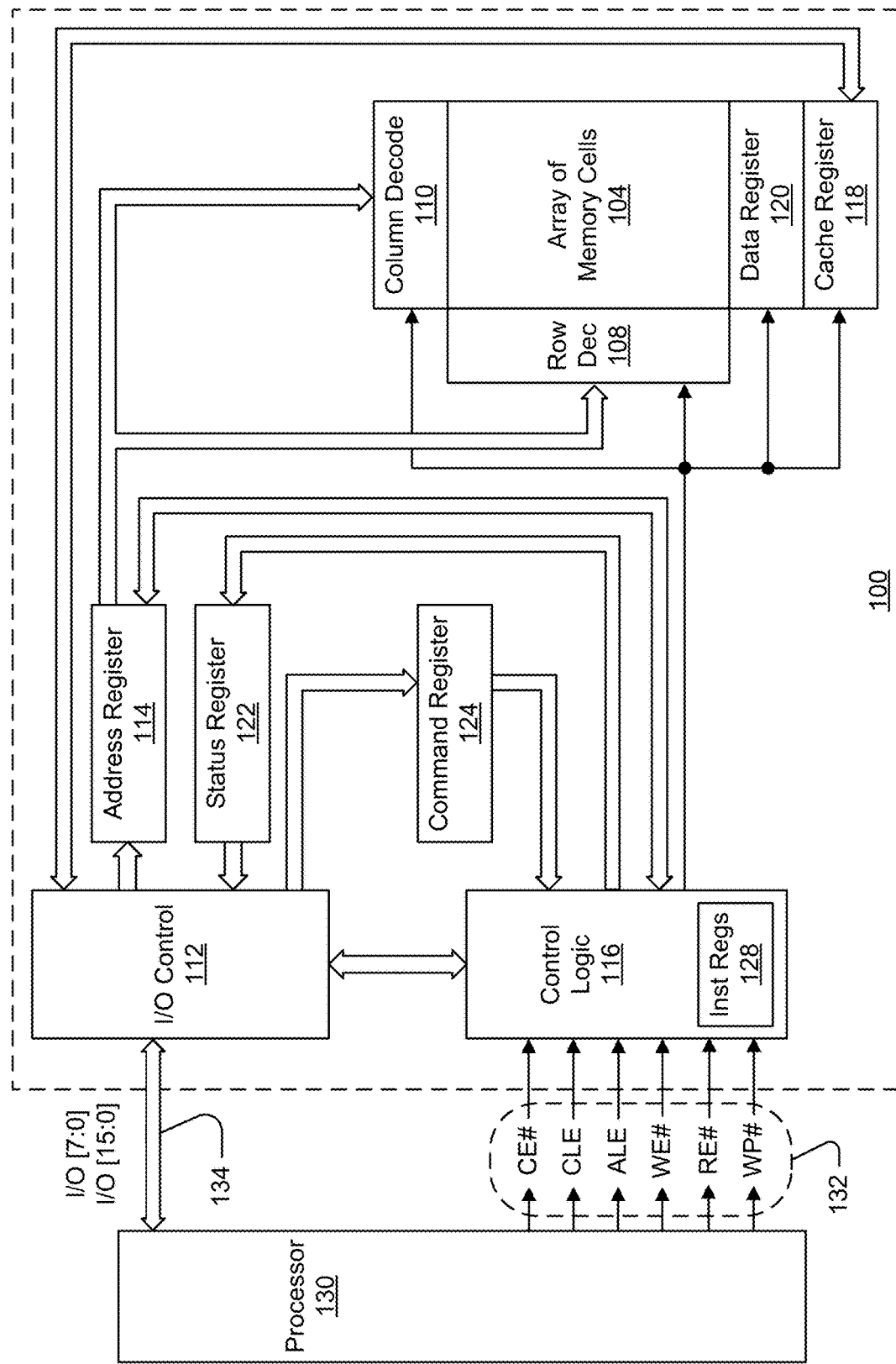
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include sense circuits (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/ output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
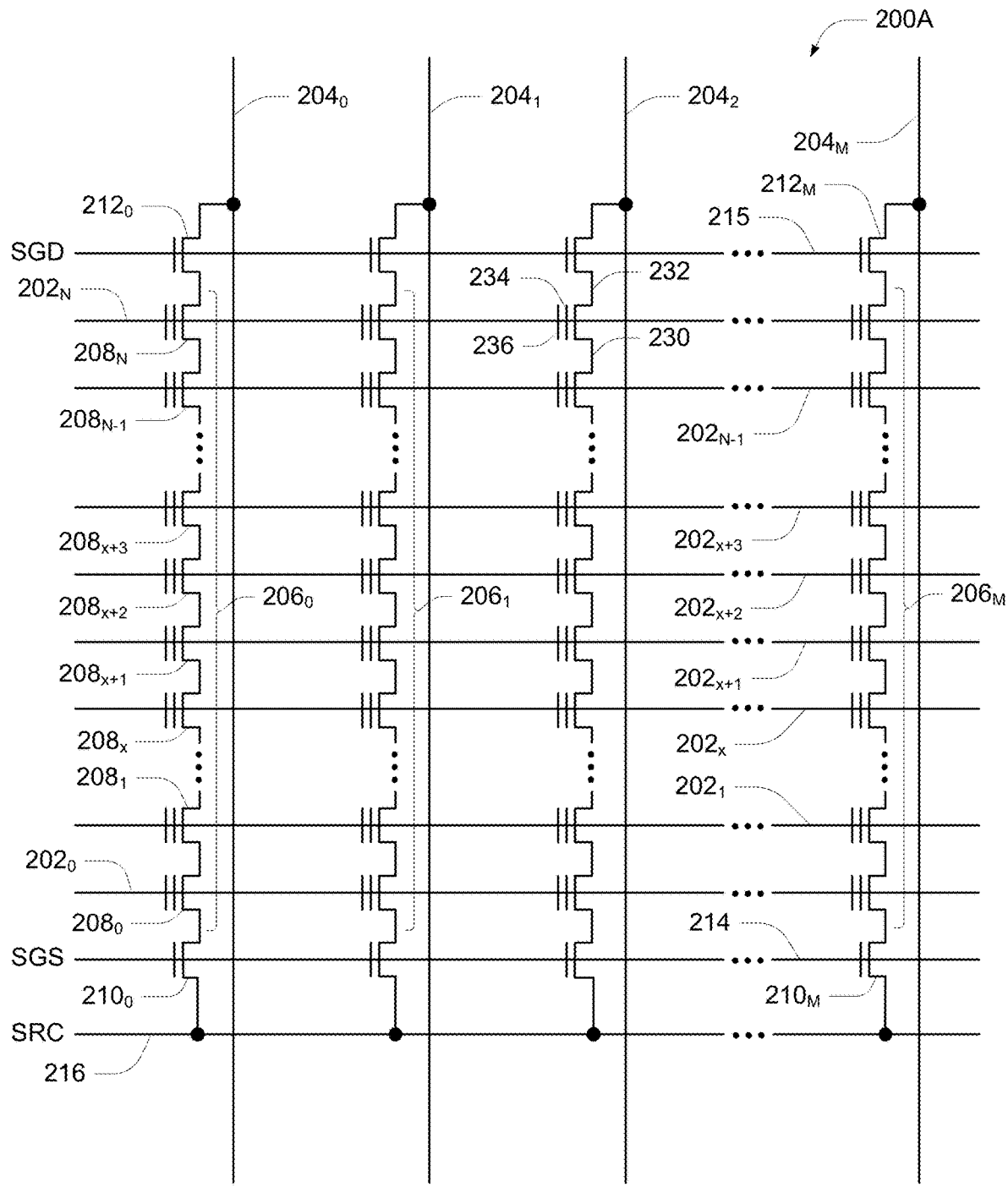
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected (e.g., selectively connected) to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
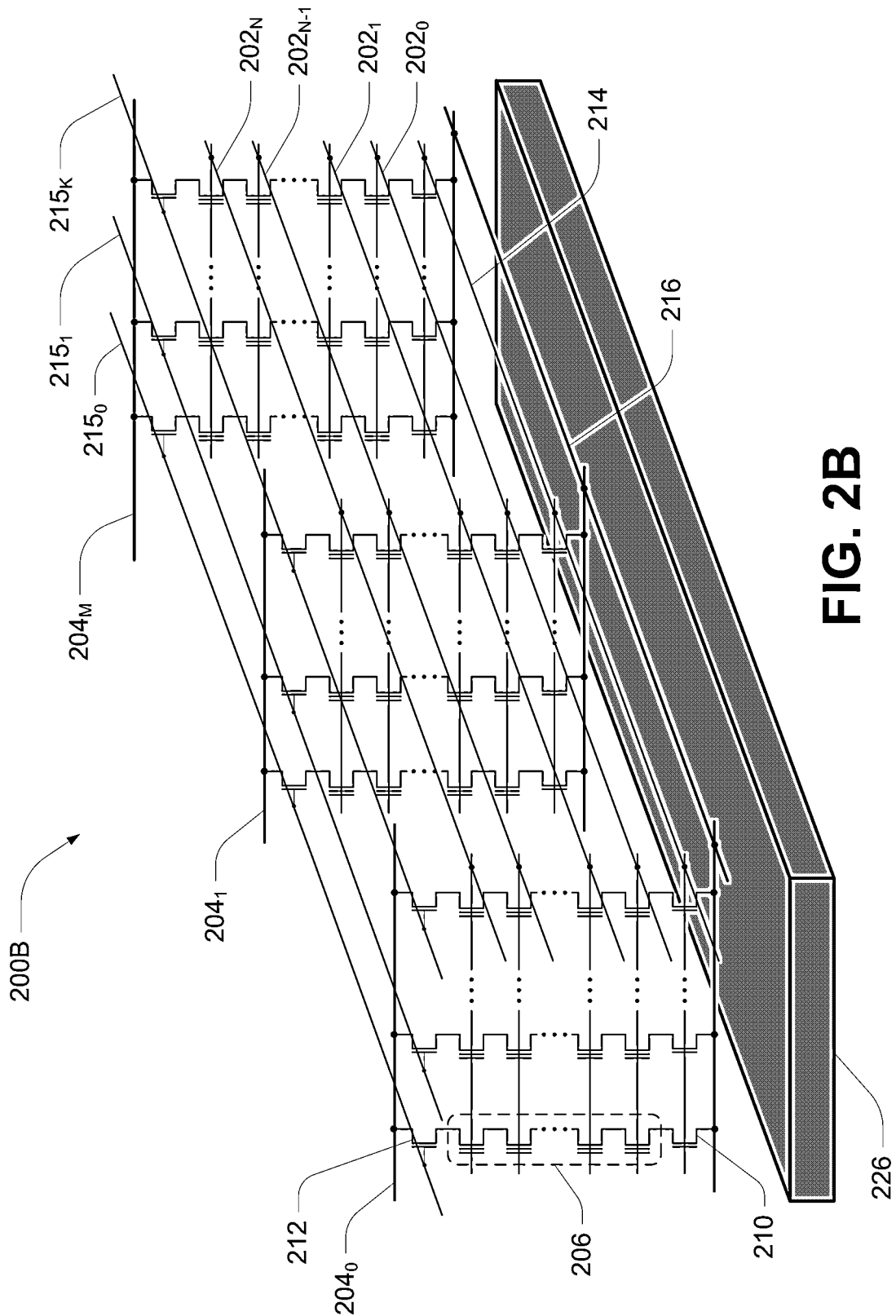

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206, e.g., a region through which current might flow when a memory cell, e.g., a field-effect transistor, is activated. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 3:
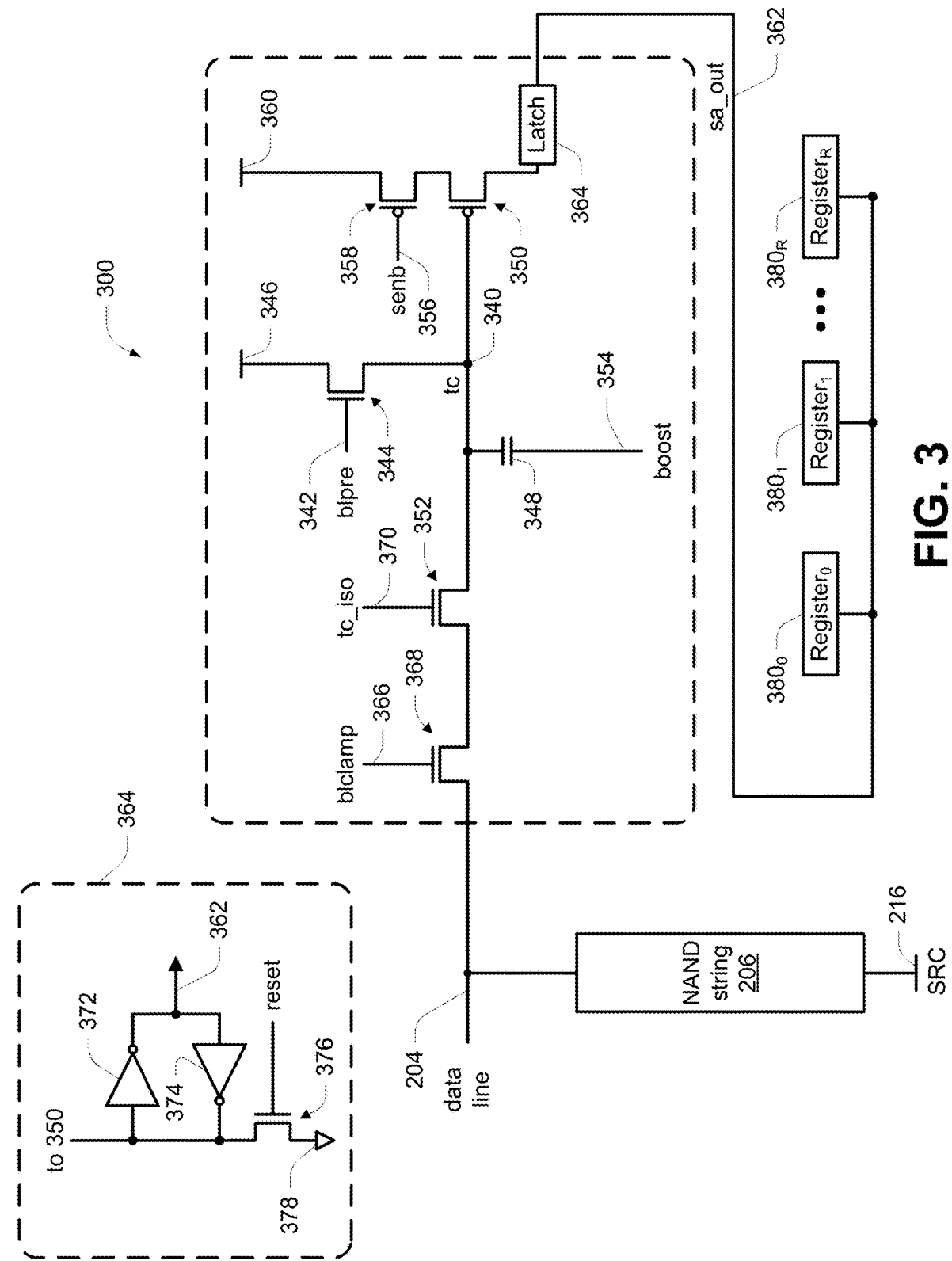
FIG. 3 is a schematic of a sense circuit of a type that might be used with various embodiments.

Sense circuits are typically utilized in memory devices to facilitate performing a sense (e.g., read and/or verify) operation on each of one or more selected (e.g., target) memory cells in the memory device, e.g., in order to determine respective data states stored by the one or more selected memory cells. FIG. 3 illustrates a sense circuit 300 of a type that might be used with various embodiments. Sense circuit 300 is shown connected to a particular NAND string 206 by a particular data line 204, such as shown in more detail in FIG. 2A, for example. Note that select transistors 210 and 212 selectively connecting the NAND string 206 to the source 216 and data line 204, respectively, are not shown in FIG. 3. While the discussion is directed to use of the sense circuit 300 with a NAND string 206, other memory structures and architectures are suitable for use with sense circuit 300 where a current path can be selectively created from the data line 204 to the source 216 dependent upon a data state of a memory cell selected for sensing. Note that each digit position of a set of data, e.g., a logical page of data, might correspond to a respective sense circuit.

As part of a sense operation, e.g., a precharge portion of the sense operation, the sense circuit 300 might precharge a sense node (e.g., tc node) 340 by activating a precharge transistor (e.g., n-type field effect transistor, or nFET) 344 by biasing (e.g., driving) the signal line 342 to a particular voltage level (e.g., a voltage level of control signal blpre) sufficient to activate the transistor 344. Control signals of the sense circuit 300 might be provided by the internal controller (e.g., control logic 116) of the memory device 100. Such control signals (e.g., both voltage levels and timing) might be defined by the sense operation and are distinguished from signals generated in response to performing the sense operation (e.g., the output signal sa_out or a voltage level generated on the sense node 340). A sense operation might be a read operation, e.g., for providing data output from the array of memory cells, or a verify operation, e.g., for verifying whether a programming pulse successfully changed a threshold voltage of a target memory cell to indicate its desired data state.

Transistor 344 is connected between a voltage node 346 and the sense node 340. Voltage node 346 might be configured to receive a supply voltage, e.g., Vcc. For some embodiments, voltage node 346 might be a variable voltage node. The capacitance 348 shown coupled to the sense node 340 might be representative of the capacitance at the sense node 340 and additional circuitry connected to it, e.g., transistors 344, 350 and 352. Voltage node 354 (e.g., a variable voltage node) is configured to apply a voltage level to the capacitance 348 which might induce a change in voltage level on the sense node 340, for example, to boost the sense node 340 to a higher voltage level, such as through capacitive coupling.

Additional transistors of the sense circuit 300 facilitate sensing of a voltage level on the sense node 340. For example, the control gate of a sense transistor (e.g., p-type field effect transistor, or pFET) 350 is shown connected to the sense node 340. Thus, transistor 350 is configured to be responsive to a voltage level present on the sense node 340. Signal line 356 connected to the gate of a sense enable transistor (e.g., pFET) 358 and configured to receive control signal senb facilitates isolating the transistor 350 from the voltage node 360, which might be configured to receive a supply voltage, e.g., Vcc. The sense circuit output (e.g., sa_out) line 362 might be connected to additional circuitry of the memory device configured to respond to the sense circuit 300 as part of a sensing operation. For example, the sense circuit 300 might be connected to a plurality of registers 380 (e.g., registers $380_0$-$380_R$), which might be components of the data register 120 of FIG. 1. The registers 380 might be configured to individually store the logic level of the output line 362 during a respective sense strobe of a plurality of sense strobes, as will be subsequently described. The registers 380 might represent volatile or non-volatile memory cells, latches or other storage locations, e.g., of the memory containing the sense circuit 300.

The output signal sa_out on output line 362 might comprise a signal generated by a latch (e.g., latch circuit) 364 which is representative of a logic level, such as a logic 'high' (e.g., represented by Vcc) or logic 'low' (e.g., represented by Vss) level indicative of a sensed data state of a selected memory cell of NAND string 206, for example. Latch 364 might be configured as a pair of cross-coupled inverters, for example. For example, a latch 364 might include a first inverter 372 having an input connected to an output of a second inverter 374 and to the transistor 350, and having an output connected to an input of the second inverter 374. A reset transistor (e.g., nFET) 376 might be connected between the input of the first inverter 372 and a voltage node 378 that might be connected to receive a reference potential, e.g., Vss, ground or 0V. Between sense operations, or between strobes of the control signal senb, the gate of transistor 376 might be biased by a voltage level (e.g., of control signal reset) to connect the input of the first inverter 372 to the voltage node 378 to return the output line 362 of the latch 364 to a default logic level, e.g., a logic high level. For some embodiments, latch 364 might be eliminated, connecting the output line 362 to the transistor 350.

During a precharge portion of a sense operation, the gate of transistor 344 might be biased by a voltage level (e.g., of control signal blpre) on signal line 342 to precharge the sense node 340 by injecting a precharge current into the sense node 340. An additional voltage level (e.g., of control signal blclamp) might be applied to signal line 366 to activate transistor (e.g., nFET) 368, and a further voltage level (e.g., of control signal tc_iso) might be applied to signal line 370 to activate transistor (e.g., nFET) 352. Activating transistors 344, 352 and 368 can serve to connect data line 204 to the voltage node 346, thereby precharging the sense node 340 and the data line 204, e.g., concurrently.

Following the precharging of the sense node 340 and the data line 204, a second portion of the sense operation might be performed to detect whether or not the precharged data line 204 and sense node 340 is discharged during the sense operation, thereby determining the data state of the memory cell selected for sensing. In general, following the precharging of the sense node 340 and the data line 204, the sense node 340 might be isolated from the data line 204, such as by deactivating the transistor 368 and/or deactivating the transistor 352. The data line 204 can then be selectively connected to the source 216 depending upon whether the memory cell selected for sensing is activated or deactivated in response to a sense voltage applied to its control gate.

After the data line 204 is given an opportunity to discharge if current is flowing through the NAND string 206, the sense node 340 might again be connected to the data line 204 by activating the transistors 352 and 368. If a voltage level of the data line 204 is lower than the precharge voltage level due to current flow through the NAND string 206, the voltage level of the sense node 340 will likewise experience a drop. If the voltage level of the data line 204 remains at the precharge voltage level, such as when the memory cell selected for sensing remains deactivated, the voltage level of the sense node 340 might remain at its precharge (or boosted) voltage level. With the transistor 358 activated, and the voltage level of the sense node 340 applied to the control gate of the transistor 350, the voltage node 360 might be selectively connected to the latch 364 through the sense transistor 350 depending upon a voltage level of the sense node 340. The output of the latch 364 might have a particular logic level (e.g., logic high) prior to sensing. If the voltage level of the voltage node 360 is applied to the input of the latch 364 upon activation of the transistor 358, its output logic level might change, e.g., from a logic high level to a logic low level, and if the voltage node 360 remains isolated from the input of the latch 364 upon activation of the transistor 358, its output logic level might remain at the particular logic level.

Boosting and deboosting of the sense node 340 might be utilized during the sense operation. Boosting (e.g., capacitively coupling a first boost voltage level to) and deboosting (e.g., capacitively coupling a second, lower, boost voltage level to) the sense node 340 might be used, for example, to facilitate a higher develop overhead. By boosting the sense node 340 prior to the sense node develop time, the voltage level of the sense node 340 can be allowed to develop longer without prematurely indicating current flow of the data line 204. Subsequent deboosting of the sense node 340 after isolation from the NAND string 206 from the data line 204 might permit the voltage level of the sense node 340 to drop below the trip point (e.g., threshold voltage) of the transistor 350 to indicate that current flow (e.g., a threshold level of current flow) was detected.

The trip point of the sense circuit 300 might generally be dependent upon the threshold voltage of the transistor 350. The sense circuit 300 is typically configured to have a trip point (e.g., sense threshold level) close to the precharge voltage level that might be established on the sense node 340 prior to sensing the selected memory cell. The trip point might be a particular voltage level on the sense node 340 wherein the sense circuit 300 outputs a first logic level indicative of a first state of the sense node 340, e.g., when the voltage level of the sense node 340 is above (e.g., equal to or above) the trip point. The sense circuit 300 might output a second logic level indicative of a second state of the sense node 340, e.g., when the voltage level of the sense node 340 is below the trip point, for example. The sensed state of the sense node 340 can be used to provide an indication of the data state of the sensed memory cell.

Figure 4:
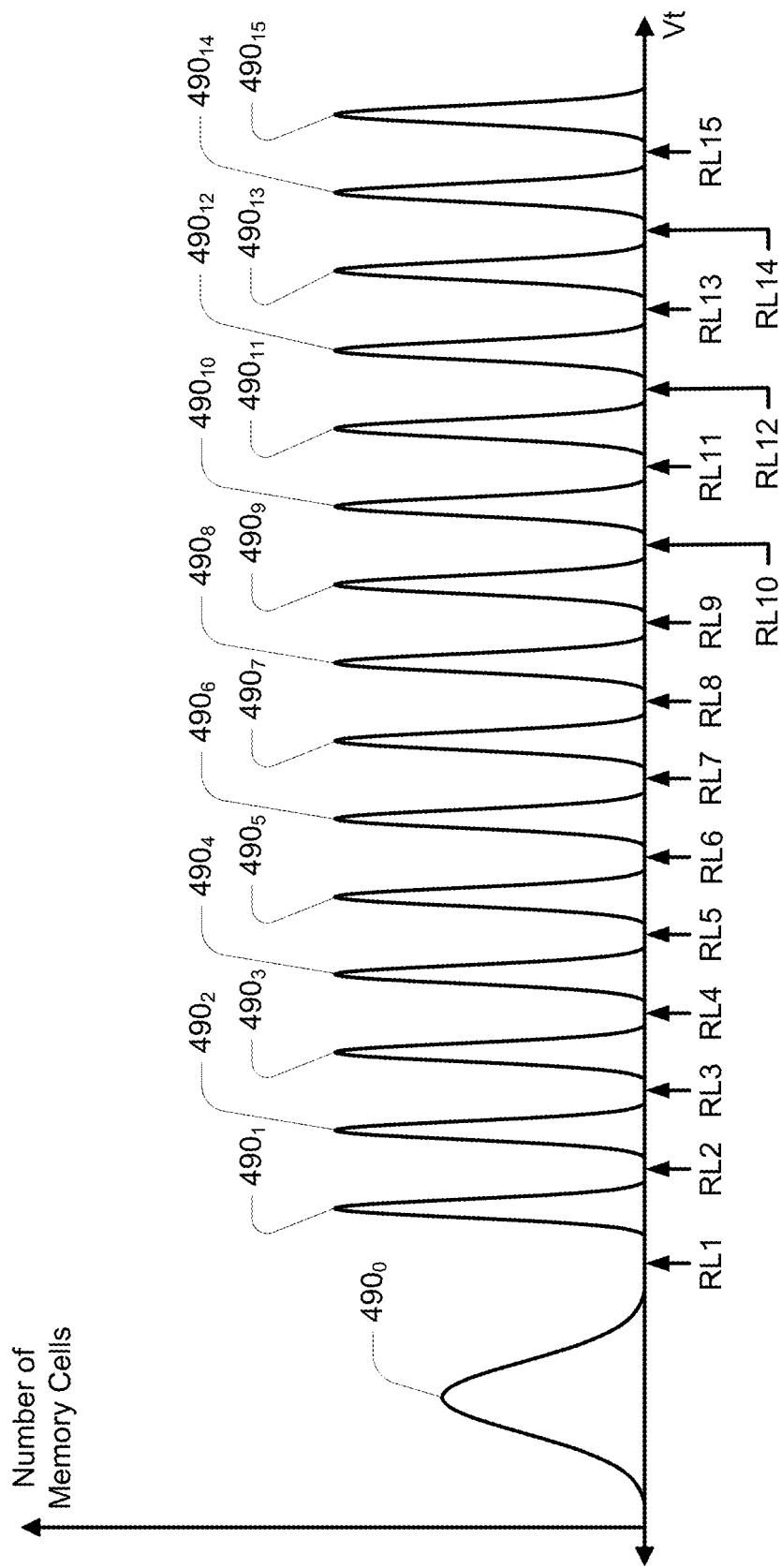
FIG. 4 is a conceptual depiction of threshold voltage distributions of a plurality of memory cells.

FIG. 4 is a conceptual depiction of threshold voltage distributions of a plurality of memory cells. FIG. 4 illustrates an example of threshold voltage distributions for a population of a sixteen-level memory cells, often referred to as QLC memory cells. For example, such a memory cell might be programmed to a threshold voltage (Vt) that falls within one of sixteen different threshold voltage distributions $490_0$-$490_{15}$, each being used to represent a data state corresponding to a bit pattern of four bits. The threshold voltage distribution $490_0$ typically has a greater width (e.g., voltage range) than the remaining threshold voltage distributions $490_1$-$490_{15}$ as memory cells are generally all placed in the data state corresponding to the threshold voltage distribution $490_0$, then subsets of those memory cells are subsequently programmed to have threshold voltages in one of the threshold voltage distributions $490_1$-$490_{15}$. As programming operations are generally more incrementally controlled than erase operations, these threshold voltage distributions $490_1$-$490_{15}$ might tend to have tighter distributions.

The threshold voltage distributions $490_0$, $490_1$, $490_2$, $490_3$, $490_4$, $490_5$, $490_6$, $490_7$, $490_8$, $490_9$, $490_{10}$, $490_{11}$, $490_{12}$, $490_{13}$, $490_{14}$ and $490_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage distributions $490_0$, the memory cell in this case might be storing a data state L0 having a data value of logical '1111' and is typically referred to as the erased state of the memory cell. If the threshold voltage is within the second of the sixteen threshold voltage distributions $490_1$, the memory cell in this case might be storing a data state L1 having a data value of logical '0111'. If the threshold voltage is within the third of the sixteen threshold voltage distributions $490_2$, the memory cell in this case might be storing a data state L2 having a data value of logical '0011', and so on. Table 1 provides one possible correspondence between the data states and their corresponding logical data values. Other assignments of data states to logical data values are known. For QLC memory cells, the least significant digit (e.g., least significant bit) of the data state might be referred to as lower page (LP) data, the next significant digit of the data state might be referred to as upper page (UP) data, the next significant digit of the data state might be referred to as extra page (XP) data, and the most significant digit of the data state might be referred to as top page (TP) data. Memory cells remaining in the lowest data state (e.g., the erased state or L0 data state), as used herein, will be deemed to be programmed to the lowest data state.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Determining the data states of the memory cells of the threshold voltage distributions $490_0$-$490_{15}$ might include applying sense voltages, e.g., read levels RL1-RL15, to the access line connected to the control gates of the memory cells of the threshold voltage distributions $490_0$-$490_{15}$, and sensing whether any of those memory cells were activated in response to any one of those sense voltages. In the example of FIG. 4 and Table 1, it can be seen that applying the read level RL8 might be used to determine whether the LP data is a logical 0 or a logical 1. Applying the read levels RL4 and RL12 might be used to determine whether the UP data is a logical 0 or a logical 1, with memory cells activating in response to the read level RL4 and memory cells and not activating in response to the read level RL12 having a logical 1 value, and with memory cells first activating in response to the read level RL12 having a logical 0 value. For some embodiments, the read levels RL4 and RL12 might be applied in sequence from lowest to highest. In like fashion, applying the read levels RL2, RL6, RL10 and RL14 can be used to determine the XP data, while applying the read levels RL1, RL3, RL5, RL7, RL9, RL11, RL13 and RL15 can be used to determine the TP data. For some embodiments, the read levels RL2, RL6, RL10 and RL14 might be applied in sequence from lowest to highest, and the read levels RL1, RL3, RL5, RL7, RL9, RL11, RL13 and RL15 might be applied in sequence from lowest to highest. Alternatively, the read levels RL1-RL15 might be applied in sequence, e.g., from lowest to highest, with memory cells being deemed to have the data state L0 if first activated in response to the read level RL1, memory cells being deemed to have the data state L1 if first activated in response to the read level RL2, memory cells being deemed to have the data state L2 if first activated in response to the read level RL3, and so on. Memory cells remaining deactivated in response to the read level RL15 might be deemed to have the data state L15.

Following programming, threshold voltages of memory cells might shift due to such phenomena as quick charge loss (QCL). QCL is a de-trapping of electrons near a gate dielectric interface out to the channel region of the memory cell over time after a programming pulse is applied, and can cause a Vt shift shortly after the programming pulse. When a memory cell passes the verify operation, the programmed threshold voltage might appear to be higher due to the trapped charge in the gate dielectric. When the memory cell is read after the program operation has been completed, the memory cell might have a Vt that is lower than the Vt obtained during the program verify operation due to the charge in the gate dielectric leaking out to the channel region. Threshold voltages of memory cells might further shift due to cumulative charge loss over the age of their programmed data, e.g., a period of time between programming the data and reading the data, referred to herein as data age. Charge loss can also be affected by memory cell age. Memory cell age, as opposed to data age, is often indicated in terms of a number of program/erase cycles the memory cells have experienced. These various phenomena might result in a widening and shifting of the threshold voltage distributions over time.

In addition to shifting and widening of threshold voltage distributions over time, fast trap/de-trap of electrons of transistors, e.g., memory cells 208 and/or sense transistors 350, can also lead to errors in sensing. Such random trapping and de-trapping of electrons in a transistor might vary its threshold voltage by tens of millivolts (mV) around a nominal threshold voltage. For example, in a situation where three electrons might be involved in trapping and de-trapping in a transistor, e.g., a memory cell, that transistor might have four possible threshold voltages corresponding to the situations where all three of the electrons are trapped, two of the electrons are trapped and one of the electrons is de-trapped, one of the electrons is trapped and two of the electrons are de-trapped, and all three of the electrons are de-trapped. As such, a transistor might be activated by a given control gate voltage at one point in time, and, fractions of a second later, that transistor might be deactivated by the same control gate voltage, and vice versa. For a memory cell whose nominal threshold voltage is near a voltage level of a sense voltage, e.g., a read level, this might mean that it could be activated or deactivated by the sense voltage depending upon the exact moment of applying the sense voltage. As such, the memory cell might be activated in response to the sense voltage when its intended data state would be indicated by a deactivated memory cell, or deactivated in response to the sense voltage when its intended data state would be indicated by an activated memory cell. Similarly, for a sense transistor (e.g., a pFET sense transistor), random trapping and de-trapping of electrons might mean that it could be activated in response to a sense node voltage level above its intended trip point, e.g., its nominal threshold voltage, or deactivated in response to a sense node voltage below its intended trip point.

Figure 5A:
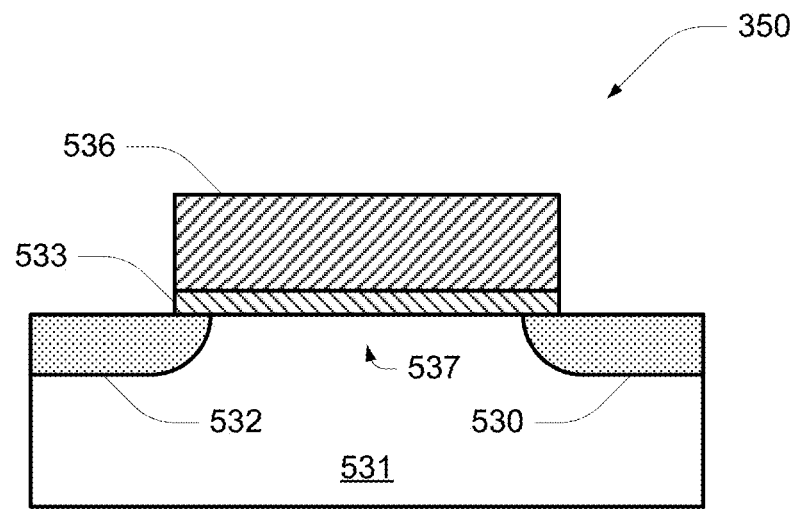
FIGS. 5A-5B depict cross-sectional views of transistors that might be used with various embodiments.
Figure 5B:
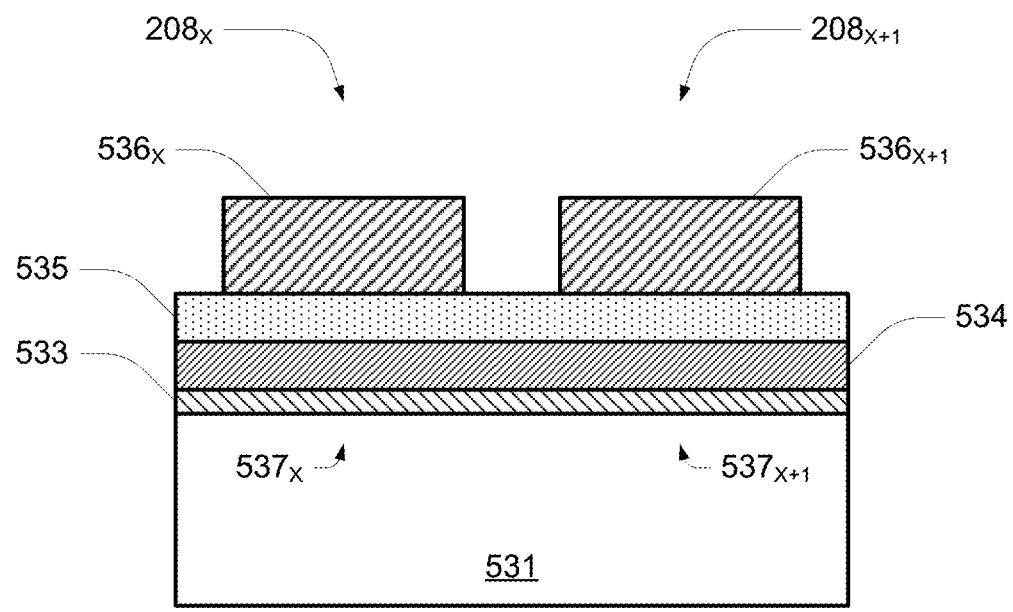

FIGS. 5A-5B depict cross-sectional views of transistors, e.g., field-effect transistors, that might be used with various embodiments, and that might be subject to trapping/de-trapping of electrons that could affect accurate sensing of a data state of a memory cell. FIG. 5A depicts a sense transistor 350, while FIG. 5B depicts two memory cells 208, e.g., memory cells $208_X$ and $208_{X+1}$, of a NAND string 206.

In FIG. 5A, the sense transistor 350 might include a first source/drain region 530 and second source/drain region 532 formed in a semiconductor 531, a gate dielectric 533 formed overlying the semiconductor 531 and portions of the first source/drain region 530 and second source/drain region 532, and a control gate 536 formed overlying the gate dielectric 533. The portion of the semiconductor 531 between the first source/drain region 530 and second source/drain region 532 might define a channel 537 of the sense transistor 350. Trapping of electrons might occur, for example, at an interface between the gate dielectric 533 and the channel 537, and/or at an interface between the control gate 536 and the gate dielectric 533.

In FIG. 5B, the memory cell $208_X$ might include a portion of a gate dielectric 533 formed adjacent a semiconductor 531, a portion of a charge-storage material 534 formed adjacent the gate dielectric 533, a portion of a charge-blocking material 535 formed adjacent the charge-storage material 534, and the control gate $536_X$. The memory cell $208_{X+1}$ might include a portion of a gate dielectric 533 formed adjacent a semiconductor 531, a portion of a charge-storage material 534 formed adjacent the gate dielectric 533, a portion of a charge-blocking material 535 formed adjacent the charge-storage material 534, and the control gate $536_{X+1}$. A portion of the semiconductor 531 in line with the control gate $536_X$ and adjacent the gate dielectric 533 might define a channel $537_X$ of the memory cell $208_X$. A portion of the semiconductor 531 in line with the control gate $536_{X+1}$ and adjacent the gate dielectric 533 might define a channel $537_{X+1}$ of the memory cell $208_{X+1}$. Although not depicted in FIG. 5B, the memory cells $208_X$ and $208_{X+1}$ might further include defined source/drain regions such as depicted in the sense transistor 350 of FIG. 5A. In such an embodiment, the memory cells $208_X$ and $208_{X+1}$ might share a source/drain region. Trapping of electrons might occur, for example, at an interface between the gate dielectric 533 and the channel 537, at an interface between the control gate 536 and the charge-blocking material 535, and/or at grain boundaries of the channels 537 when formed of polycrystalline channel materials, e.g., polycrystalline silicon commonly referred to as polysilicon.

Figure 6A:
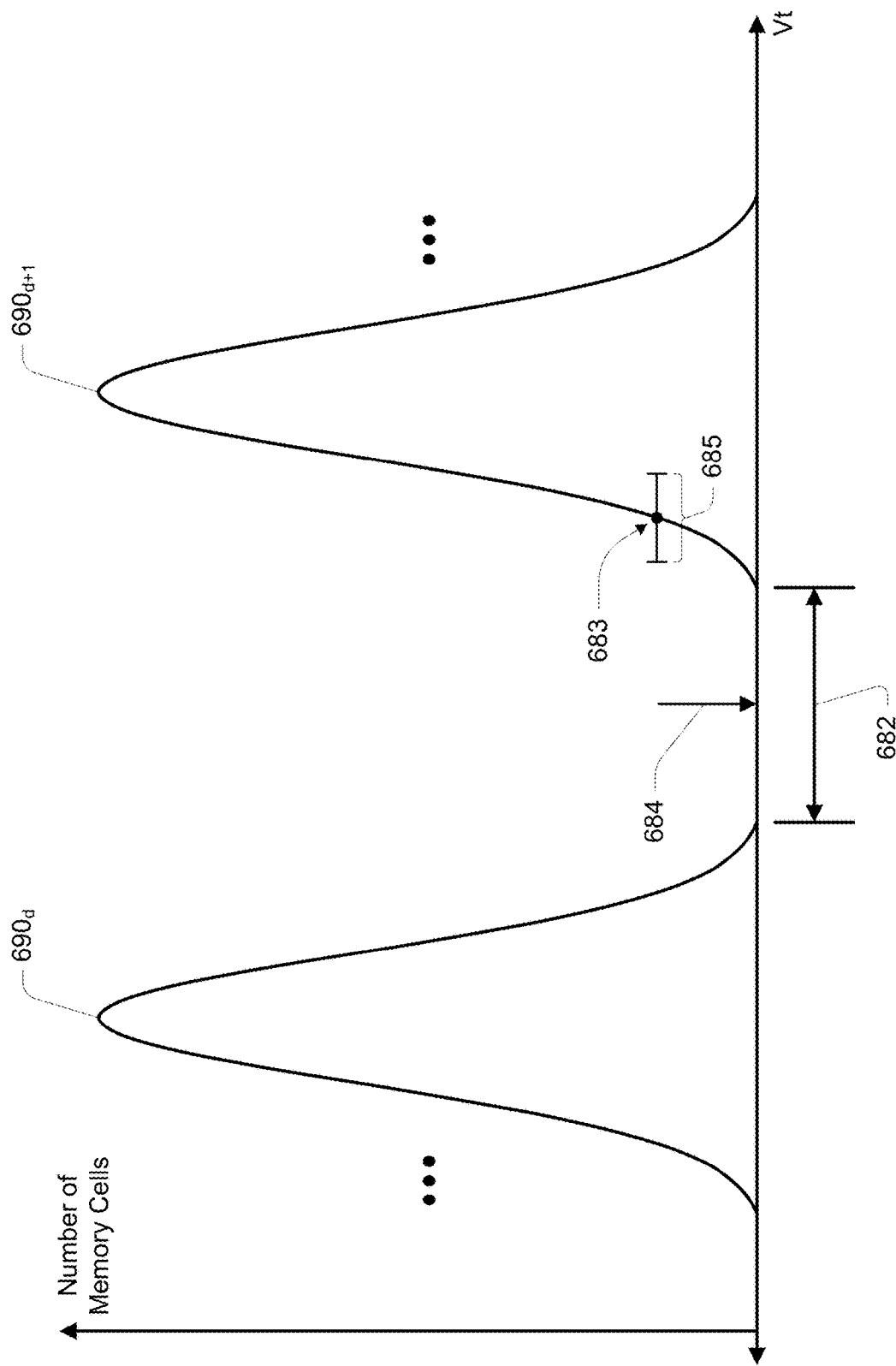
FIGS. 6A-6B are conceptual depictions of threshold voltage distributions of a plurality of memory cells at different stages following programming for use with embodiments.
Figure 6B:
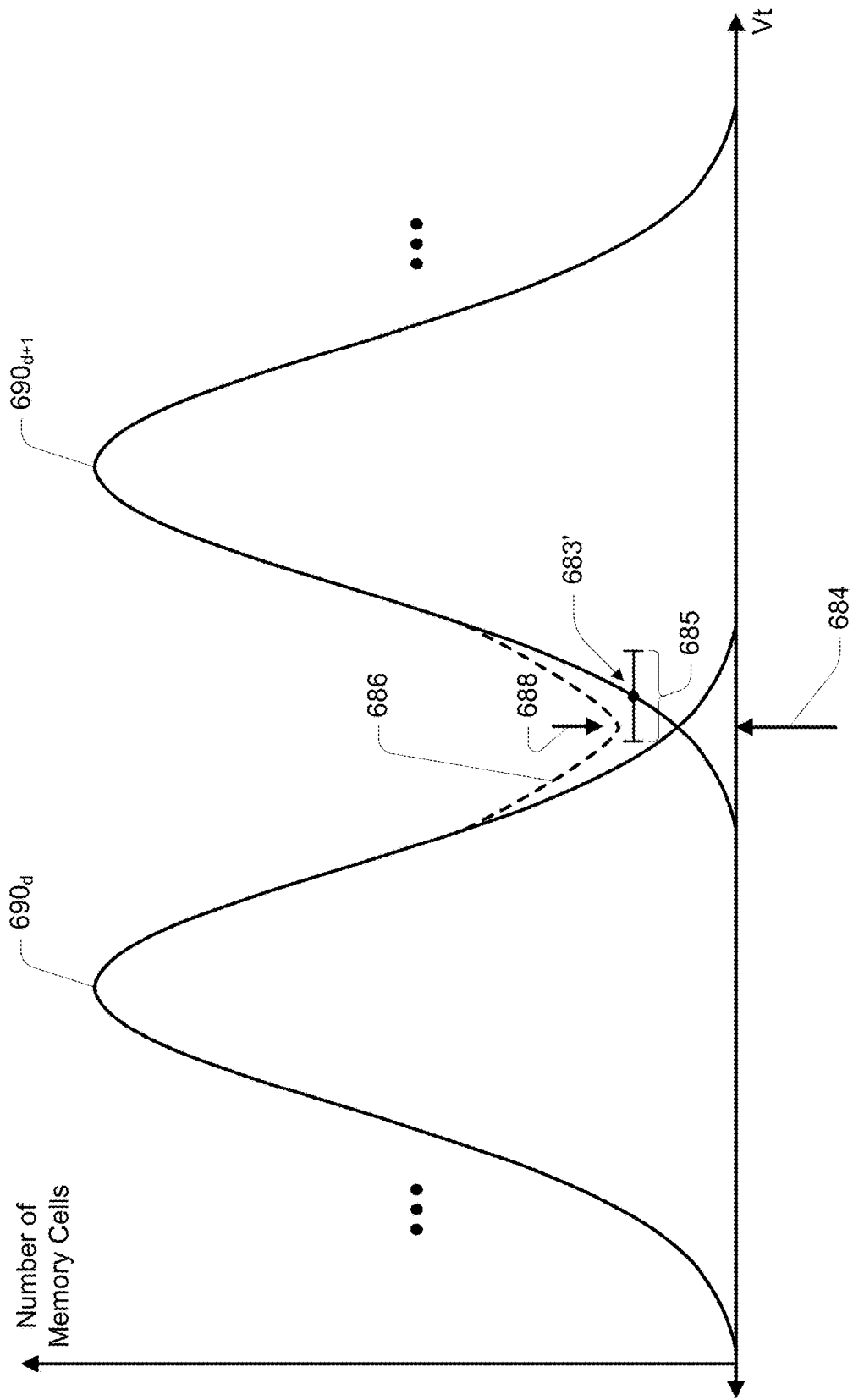

FIGS. 6A-6B are conceptual depictions of threshold voltage distributions of a plurality of memory cells at different stages following programming for use with embodiments. FIG. 6A is a conceptual depiction of threshold voltage distributions of a plurality of memory cells following (e.g., immediately following) a programming operation, while FIG. 6B is a conceptual depictions of those same threshold voltage distributions at some later time following that programming operation. The threshold voltage distributions $690_d$-$690_{d+1}$ of FIGS. 6A and 6B might conceptually represent some portion of the distributions for threshold voltage distributions $490_0$-$490_{15}$ of FIG. 4 at the completion of a programming operation for memory cells, e.g., any two adjacent threshold voltage distributions 490.

With reference to FIG. 6A, adjacent threshold voltage distributions 690 are typically separated by some margin (e.g., dead space) 682 at the completion of programming. Applying a voltage level of a sense voltage (e.g., read level) 684 within the margin 682 to the control gates of the plurality of memory cells might be used to distinguish between the memory cells of the threshold voltage distribution $690_d$ (and any lower threshold voltage distribution) and the memory cells of the threshold voltage distribution $690_{d+1}$ (and any higher threshold voltage distribution), conceivably without error. A memory cell within the distribution $690_{d+1}$ might have a nominal threshold voltage 683, and might have a range of possible threshold voltages 685 due to fast trap/de-trap of electrons. In the example of FIG. 6A, this variation of threshold voltages across the range of threshold voltages 685 might not be expected to lead to an erroneous determination of its data state upon sensing in response to the sense voltage 684.

With reference to FIG. 6B, adjacent threshold voltage distributions might have widened, such that the threshold voltage distribution $690_d$ and the threshold voltage distribution $690_{d+1}$ might merge as represented by the curve 686 indicating a union of the two adjacent threshold voltage distributions. The curve 686 might have a local minima 688. Where such merging of adjacent threshold voltage distributions occurs, distinguishing between memory cells intended to be in the threshold voltage distribution $690_d$ and memory cells intended to be in the threshold voltage distribution $690_{d+1}$ will generally result in some error. For example, applying a sense voltage 684, having a voltage level corresponding to the local minima 688, to the control gates of the plurality of memory cells might be expected to produce the least number of memory cells having a data state other than their target (e.g., intended) data state, but a certain number of errors would generally be inevitable. Applying a sense voltage higher or lower than the voltage level corresponding to the local minima 688 might be expected to produce larger numbers of errors. Determining the sense voltage 684 corresponding to the local minimal 688 is outside the scope of this disclosure, but an example can be found in U.S. Pat. No. 10,818,363 B1, issued Oct. 27, 2020 to Valeri et al.

In the example of FIG. 6B, the memory cell within the distribution $690_{d+1}$ might now have a nominal threshold voltage 683', but might have a same or similar range of possible threshold voltages 685 around its nominal threshold voltage 683' due to fast trap/de-trap of electrons. In the example of FIG. 6B, this variation of threshold voltages across the range of threshold voltages 685 might or might not lead to an erroneous determination of its data state upon sensing in response to the sense voltage 684, depending upon where in its range of threshold voltages 685 it happens to be when sensed.

Error correction schemes are commonly used to identify and correct erroneous digits of data. However, error correction schemes have limitations on the number of errors they are capable of identifying and correcting. Some known error correction schemes might utilize error correction code (ECC) data conforming to Hamming codes, horizontal/vertical parity codes, convolution codes, Recursive Systematic Codes (RSC), Trellis-Coded Modulation (TCM), Block Coded Modulation (BCM), Bose-Chaudhuri-Hocquenghem (BCH) codes, Reed-Solomon codes, turbo codes, cyclic redundancy codes (CRC) or low density parity check (LDPC) codes, although this disclosure is not limited to a particular error correction scheme or its coding. The number of correctable errors generally can be increased through the use of larger amounts of error correction code data, or through the use of more robust error correction schemes, but these generally require more storage space and more computation time, respectively, to effect the corrections. As such, it is generally advantageous to reduce the number of errors during sensing. Error correction of data errors in this manner is well understood in the art and will not be detailed herein.

Various embodiments might be used to mitigate errors resulting from fast trapping/de-trapping of electrons. To address this concern, embodiments might make multiple determinations whether a memory cell was deemed to be activated or deactivated in response to a sense voltage level applied to its control gate. Such embodiments might then determine whether a majority of those determinations indicated activation or deactivation of the memory cell. In response to the majority of those determinations indicating activation, the memory cell might be deemed to have been activated while applying the sense voltage level to its control gate. In response to the majority of those determinations indicating deactivation, the memory cell might be deemed to have been deactivated while applying the sense voltage level to its control gate. The majority determination might further be used to assign a data state to the memory cell.

Figure 7:
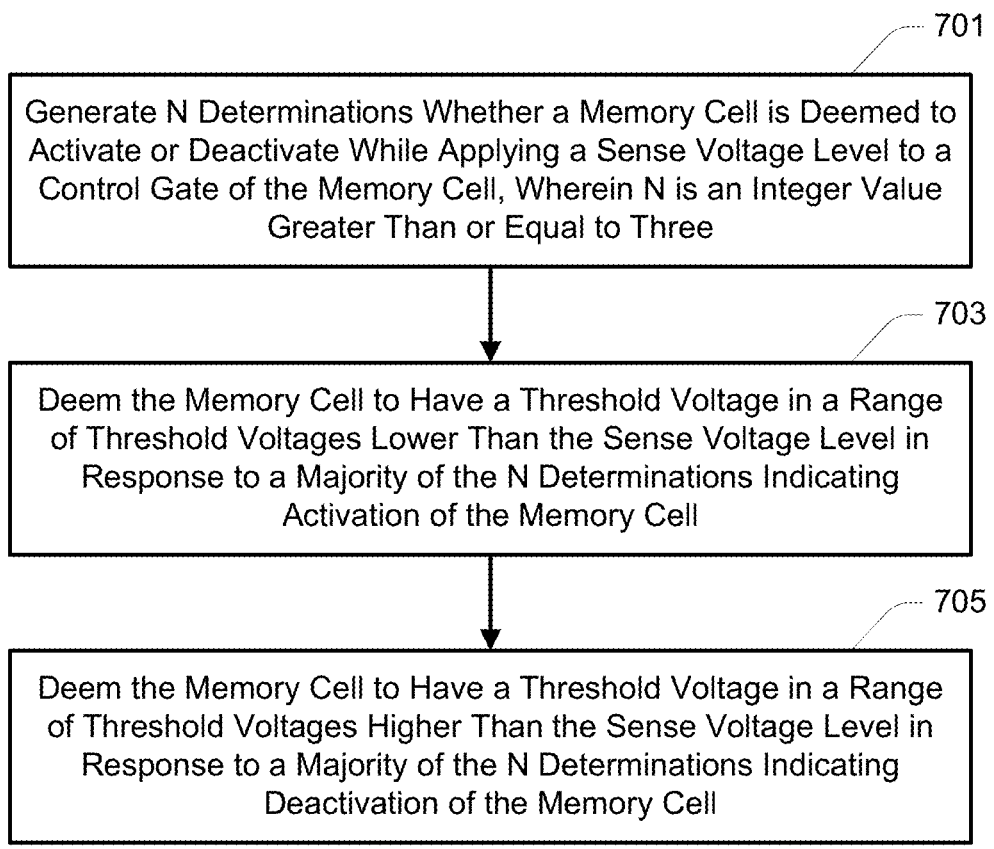
FIG. 7 is a flowchart of a method of operating a memory in accordance with an embodiment.

FIG. 7 is a flowchart of a method of operating an apparatus, e.g., a memory, in accordance with an embodiment. The method might represent actions associated with determining a data state of a memory cell of the apparatus. The method might be in the form of computer-readable instructions, e.g., stored to the instruction registers 128. Such computer-readable instructions might be executed by a controller, e.g., the control logic 116, to cause the relevant components of the apparatus to perform the method.

At 701, N determinations whether a memory cell is deemed to activate or deactivate while applying a sense voltage level to a control gate of the memory cell might be generated. As will be further described infra, the N determinations might be generated as a result of performing N sense operations, or as a result of strobing a sense circuit N times (e.g., checking for activation of the sense transistor 350 by strobing the control signal senb N times). The result of each determination might be loaded into a respective register 380. With reference to the sense circuit 300 of FIG. 3, a memory cell might be deemed to be activated for any of the N determinations if the output signal sa_out has a logic low level for that determination, and might be deemed to be deactivated for any of the N determinations if the output signal sa_out has a logic high level for that determination.

At 703, the memory cell might be deemed to have a threshold voltage in a range of threshold voltages lower than the sense voltage level in response to a majority of the N determinations indicating activation of the memory cell. A range of threshold voltages lower than the sense voltage level might contain threshold voltages that are each lower than or equal to the sense voltage level. At 705, the memory cell might be deemed to have a threshold voltage in a range of threshold voltages higher than the sense voltage level in response to a majority of the N determinations indicating deactivation of the memory cell. For example, with reference to FIG. 6B, and assuming N=3, a memory cell being deemed to be activated in response to applying the sense voltage level 684 to its control gate for two or three of the three determinations might be deemed to have a threshold voltage in the threshold voltage distribution $690_d$ or lower, and a memory cell being deemed to be deactivated in response to applying the sense voltage level 684 to its control gate for two or three of the three determinations might be deemed to have a threshold voltage in the threshold voltage distribution $690_{d+1}$ or higher.

Figure 8:
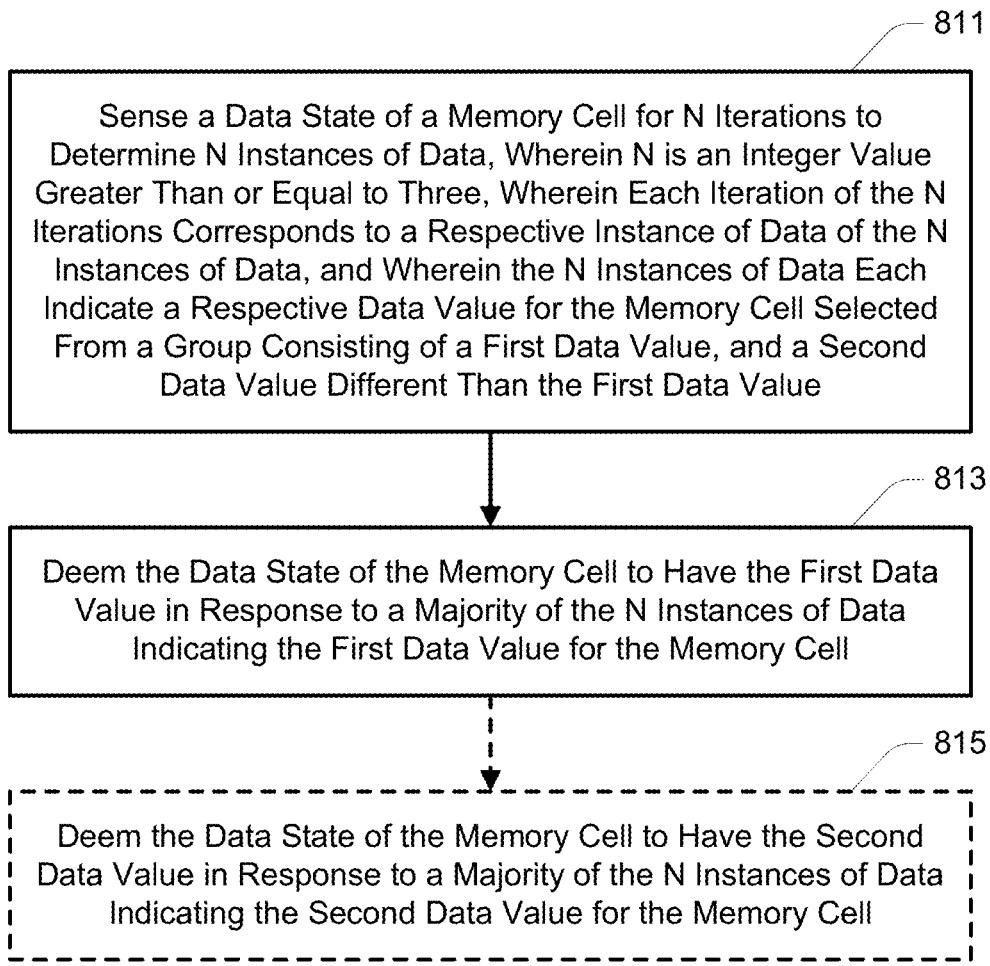
FIG. 8 is a flowchart of a method of operating a memory in accordance with another embodiment.

FIG. 8 is a flowchart of a method of operating an apparatus, e.g., a memory, in accordance with an embodiment. The method might represent actions associated with determining a data state of a memory cell of the apparatus. The method might be in the form of computer-readable instructions, e.g., stored to the instruction registers 128. Such computer-readable instructions might be executed by a controller, e.g., the control logic 116, to cause the relevant components of the apparatus to perform the method.

At 811, a data state of a memory cell might be sensed for N iterations to determine N instances of data. N might be an integer value greater than or equal to three, and each iteration of the N iterations might correspond to a respective instance of data of the N instances of data. The N instances of data each indicate a respective data value for the memory cell that might be either a first data value or a second data value different than the first data value. The first and second data values might each represent a single digit of data, such as a logical 1 or logical 0, for a particular logical page of data. The first and second data values might alternatively each represent a multi-digit pattern containing each logical page of data stored to the memory cell. For some embodiments, the second data value might be indeterminate. For example, referring to FIG. 4 and Table 1, a sense voltage level equal to the read level RL4 might indicate a logical 1 for the UP data in response to activation of the memory cell, but deactivation of the memory cell would leave the data value of the UP data indeterminate until applying the read level RL12.

As will be further described infra, the N iterations might be generated as a result of performing N sense operations, or as a result of strobing a sense circuit N times (e.g., checking for activation of the sense transistor 350 by strobing the control signal senb N times). The result of each determination might be loaded into a respective register 380. With reference to the sense circuit 300 of FIG. 3, any of the N iterations might indicate the first data value if the output signal sa_out has a logic low level for that iteration, and might indicate the second data value if the output signal sa_out has a logic high level for that iteration.

At 813, the data state of the memory cell might be deemed to have the first data value in response to a majority of the N instances of data indicating the first data value for the memory cell. Optionally, at 815, the data state of the memory cell might be deemed to have the second data value in response to a majority of the N instances of data indicating the first data value for the memory cell.

Figure 9A:
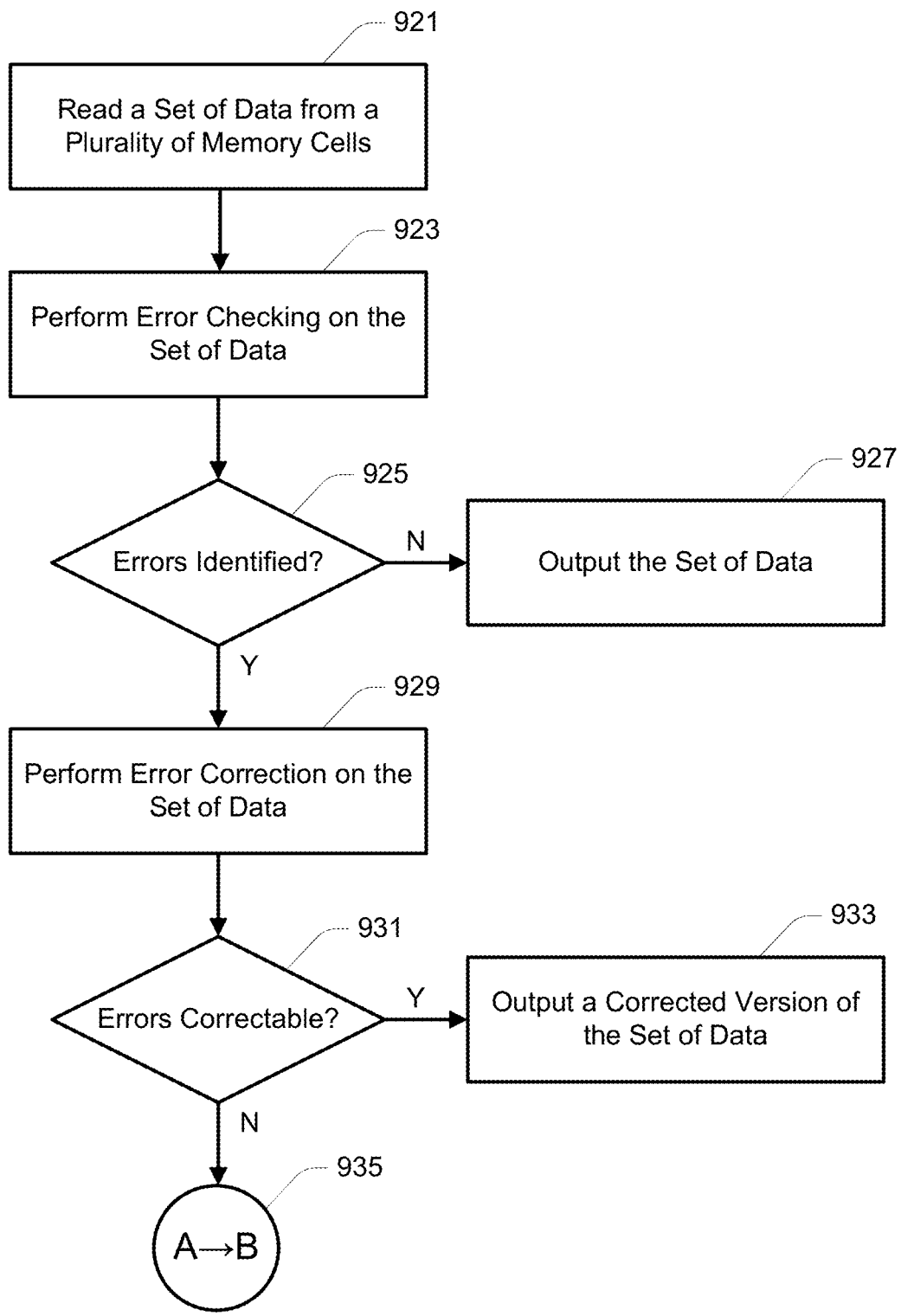
FIGS. 9A-9B are flowcharts of a method of operating a memory in accordance with a further embodiment.
Figure 9B:
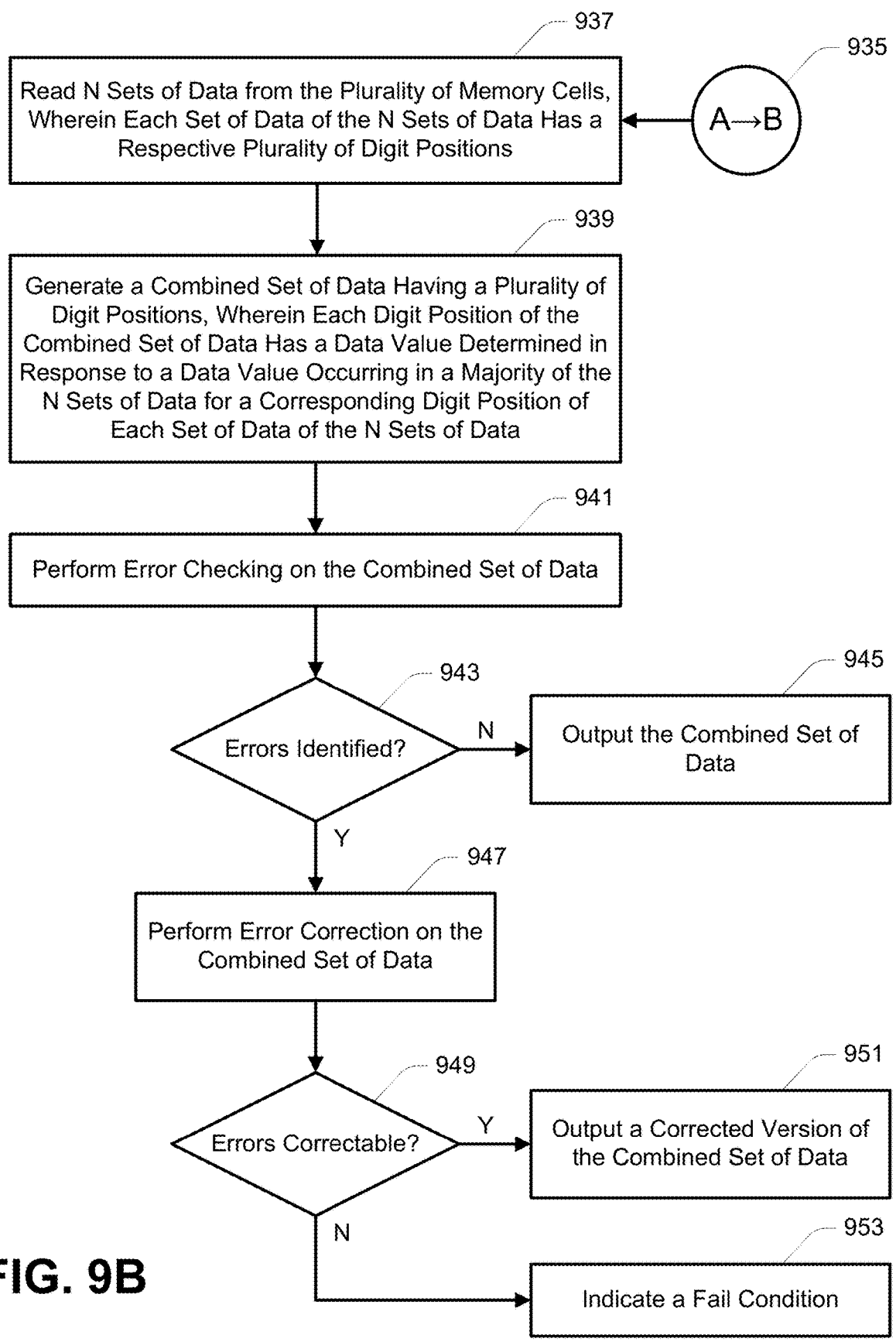

FIGS. 9A-9B are a flowchart of a method of operating an apparatus, e.g., a memory, in accordance with an embodiment. The method might represent actions associated with determining a data state of a plurality of memory cells (e.g., a page of memory cells) of the apparatus. The method might be in the form of computer-readable instructions, e.g., stored to the instruction registers 128. Such computer-readable instructions might be executed by a controller, e.g., the control logic 116, to cause the relevant components of the apparatus to perform the method.

At 921, a set of data (e.g., a page of data) might be read from a plurality of memory cells (e.g., a page of memory cells). At 923, error checking might be performed on the set of data, such as by using ECC. At 925, it might be determined whether errors were identified. If no errors were identified at 925, the set of data might be output from the apparatus at 927, e.g., to an external apparatus, processor or memory controller, as representing the data values of the plurality of memory cells. If errors were identified at 925, error correction might be performed on the set of data at 929. At 931, it might be determined whether the errors were correctable. If the errors were correctable at 931, a corrected version of the set of data might be output from the apparatus at 933, as representing the data values of the plurality of memory cells. If the errors were not correctable at 931, the process might proceed to 935.

For some embodiments, rather than proceed to 935 from 931 after reading the plurality of memory cells once, additional read operations might be performed before proceeding to 935. Performing additional read operations using varying operating parameters is a common response to determining that a number of errors in the read data exceeds the capability of the error correction scheme. For example, one or more additional read operations might be performed using different sets of read levels, e.g., predetermined sets of read levels, in an attempt to find a set of read levels that produces a correctable number of errors. Further, or alternate, escalation might include determining the shape of the threshold voltage distributions of the plurality of memory cells and repeating one or more additional read operations using read levels determined in response to the shape of the threshold voltage distributions, such as described in U.S. Pat. No. 10,818,363 B1, issued Oct. 27, 2020 to Valeri et al. While the various embodiments described herein might be used in response to a first indication of a number of errors exceeding the capability of the error correction scheme, they might alternatively, or additionally, be used in instances where multiple read operations indicate an excessive number of errors.

From 935, N sets of data (e.g., pages of data) might be read from the plurality of memory cells (e.g., a page of memory cells) at 937. Each set of data of the N sets of data might have a respective plurality of digit positions. At 939, a combined set of data having a plurality of digit positions might be generated. Each digit position of the combined set of data might have a data value determined in response to a data value occurring in a majority of the N set of data for a corresponding digit position of each set of data of the N sets of data. For example, where three sets of data have four digit positions, the first set of data might be represented as 1011, the second set of data might be represented as 1001, and the third set of data might be represented as 1011. The combined set of data might then be represented as 1011 as the first digit position (e.g., the LSB) of the three sets of data has three ones, the second digit position of the three sets of data has two ones and one zero, the third digit position of the three sets of data has three zeros, and the fourth digit position (e.g., the MSB) of the three sets of data has three ones.

At 941, error checking might be performed on the combined set of data, such as by using ECC. At 943, it might be determined whether errors were identified. If no errors were identified at 943, the combined set of data might be output from the apparatus at 945, e.g., to an external apparatus, processor or memory controller, as representing the data values of the plurality of memory cells. If errors were identified at 943, error correction might be performed on the combined set of data at 947. At 949, it might be determined whether the errors were correctable. If the errors were correctable at 949, a corrected version of the combined set of data might be output from the apparatus at 951, as representing the data values of the plurality of memory cells. If the errors were not correctable at 949, a failure condition (e.g., of a read operation) might be indicated at 953, e.g., to the external apparatus, processor or controller.

For some embodiments, rather than indicate a failure condition at 953, the process might return from 949 to 937 to read N sets of data from the plurality of memory cells using a different read level or set of read levels. For example, the apparatus might have one or more sets of additional read levels used to search for a condition that produces a correctable number of errors. Alternatively, or in addition, embodiments could determine a shape of the threshold voltage distribution and determine one or more sets of read levels in response to identifying valleys between the distributions. The failure condition might be indicated at 953 in response to none of the iterations of reading the N sets of data from the plurality of memory cells at 937 leading to a condition that produces a correctable number of errors.

Figure 10A:
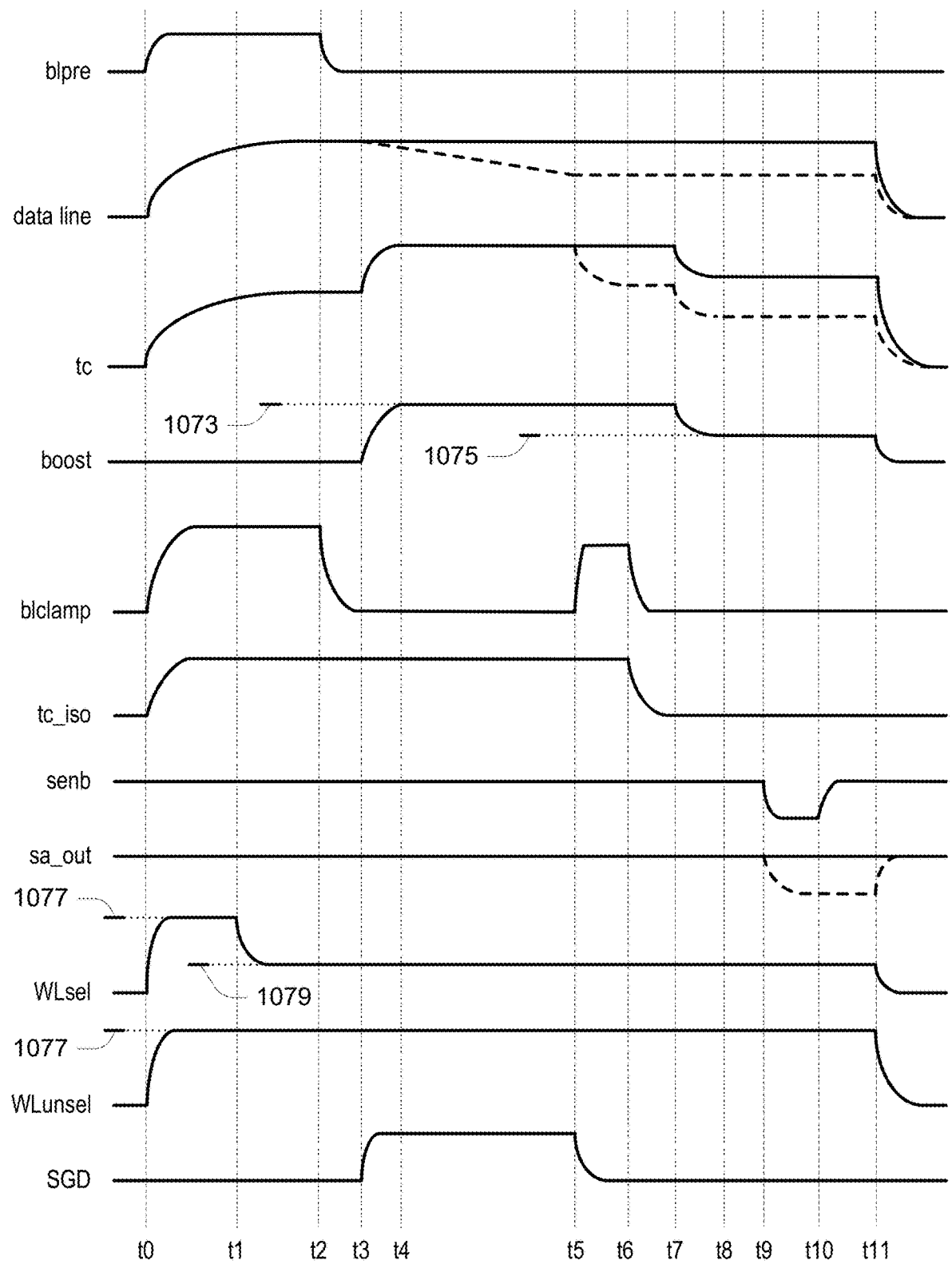
FIGS. 10A-10C are timing diagrams generally depicting voltage levels of certain nodes of sense circuits such as depicted in FIG. 3 at various stages of sense operations in accordance with embodiments.

FIG. 10A is a timing diagram generally depicting voltage levels of various nodes of a sense circuit such as the sense circuit 300 depicted in FIG. 3 at various stages of a sense operation (e.g., read operation) in accordance with an embodiment. FIG. 10A provides detail of a portion of a sense operation that might be used with embodiments. With regard to FIG. 10A, a precharge portion of the sense operation might begin at time t0 by biasing control signals blpre, blclamp and tc_iso to voltage levels sufficient to activate transistors 344, 368 and 352, respectively, thereby connecting the data line 204 and the sense node 340 to the voltage node 346. In response, the voltage level tc of the sense node 340 and the voltage level of the data line 204 might increase.

At time to, the selected access line WLsel (e.g., an access line 202 of a NAND string 206 containing a memory cell selected for the read operation), and unselected access lines WLunsel (e.g., access lines 202 of the NAND string 206 not containing memory cells selected for the read operation) might be increased to a pass voltage 1077. Although the selected access line WLsel does not need to attain the pass voltage 1077, bringing all of the access lines 202 up together in this manner might facilitate improvements in speed to steady-state of the unselected access lines 202 whose desired voltage level might be the pass voltage 1077. At time t1, the selected access line WLsel might be brought to a sense voltage level 1079 of the read operation.

At time t2, the sense node 340 might be isolated from the data line 204 and the voltage node 346, such as by biasing control signals blpre and blclamp to voltage levels sufficient to deactivate the transistors 344 and 368. Note that the control signal tc_iso might remain at the level sufficient to activate the transistor 352 as transistor 368 can provide isolation from the data line 204.

Between time t1 and time t4, the data line 204 is selectively connected to the source 216 depending upon whether the memory cell selected for sensing is activated or not in response to the sense voltage. If the memory cell is activated, the data line 204 might decrease in voltage as current flows through the NAND string 206, such as depicted in dashed line, and if the memory cell is deactivated, the data line 204 might remain at the precharge voltage level, such as depicted in solid line. An activated memory cell having a particular threshold voltage might be expected to discharge more quickly than an activated memory cell having a threshold voltage higher than the particular threshold voltage.

At time t3, a first boost voltage level 1073 might be applied at voltage node 354, thereby boosting the voltage level of the sense node 340 to a boosted voltage level (e.g., higher than the precharge voltage level) at time t4. At time t3, the data line 204 might be connected to the NAND string 206 by activating its corresponding select gate 212 by biasing the control signal SGD. The data line 204 might then be selectively connected to the source 216 depending upon whether the memory cell selected for sensing is activated or not in response to the sense voltage. If the memory cell is activated, the data line 204 might decrease in voltage as current flows through the NAND string 206, such as depicted in dashed line, and if the memory cell is deactivated, the data line 204 might remain at the precharge voltage level, such as depicted in solid line.

At time t5, the sense node 340 might again be connected to the data line 204, such as by biasing control signal blclamp to a voltage level sufficient to activate the transistor 368, and, where the data line 204 has discharged, the voltage level of the sense node 340 might be expected to decrease such as depicted in dashed line tc. Also at time t5, the data line 204 might be isolated from its NAND string 206 by biasing the control signal SGD to deactivate its select gate 212.

At time t6, the sense node 340 might be isolated from the data line 204, such as by biasing control signals blclamp and/or tc_iso to voltage levels sufficient to deactivate one or both transistors 352 and 368. At time t7, after the sense node 340 has been connected to, and subsequently isolated from, the data line 204, a second boost voltage level 1075 (which might be lower than the first boost voltage level 1073) might be applied to the voltage node 354. The change in the boost voltage level from the boost voltage level 1073 to the boost voltage level 1075 might result in a corresponding change in the voltage level tc of the sense node 340 at time t8.

At time t9, the transistor 350 might be connected to the voltage node 360 by biasing (e.g., strobing) the control signal senb to a voltage level sufficient to activate the transistor 358. If the transistor 350 is activated, the voltage node 360 is connected to the latch 364, thereby changing the logic level of the output signal sa_out, and if the transistor 350 is deactivated, the voltage node 360 remains isolated form the latch 364, allowing the logic level of the output signal sa_out to remain unchanged. While this example describes a change in logic level of the output signal sa_out (e.g., a change in the logic level of the latch 364) from a logic high level to a logic low level as indicating the voltage level of the sense node 340 being below the trip point of the transistor 350, a transition from a logic low level to a logic high level could alternatively be provided with appropriate changes in the latch 364, e.g., by providing an additional inverter to the output of the latch.

At time t10, the state of the output signal sa_out might be loaded into a respective register 380. At time t11, the various signal lines might be brought back to their initial voltage levels, e.g., indicating an end of the sense operation. To generate multiple determinations whether a memory cell is deemed to activate or deactivate while applying a sense voltage level, the sense operation of FIG. 10A might be repeated additional times, while loading the respective output signals sa_out to respective registers 380.

Figure 10B:
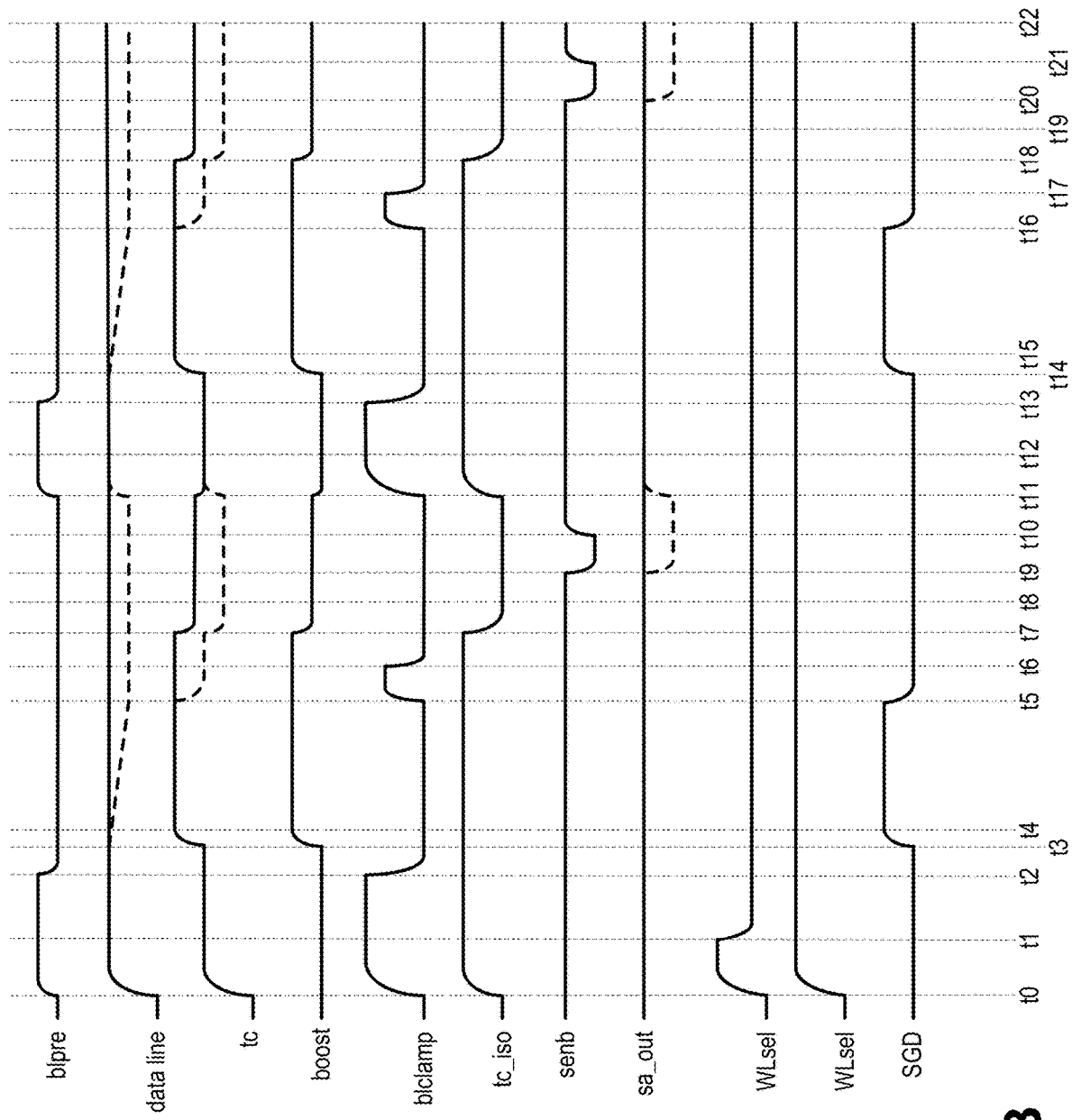

FIG. 10B is a timing diagram generally depicting voltage levels of various nodes of a sense circuit such as the sense circuit 300 depicted in FIG. 3 at various stages of multiple sense operations (e.g., read operations) in accordance with an embodiment. FIG. 10B is a variation including a sense operation such as depicted in FIG. 10A. It is recognized that time and energy savings could be obtained by not returning all signal lines to their initial voltage levels after loading the value of the output signal sa_out to a register 380. The description of FIG. 10A for times t0 to t11 might generally describe times t0 to t11 of FIG. 10B. However, while the output signal sa_out might be returned to its initial value at time t11 in FIG. 10B by resetting the latch 364, the remaining signal lines might not be returned to their initial values. As such, the description of FIG. 10A for times t0 to t11 might further describe times t11 to t22 of FIG. 10B with the exception that the selected access line WLsel might remain at the sense voltage level, and the unselected access lines WLunsel might remain at the pass voltage. The process corresponding to times t11 to t22 might be repeated once for each additional sense operation desired. Each loading of a register 380, e.g., at times t10 and t21 of FIG. 10B, might load to a different register 380.

Figure 10C:
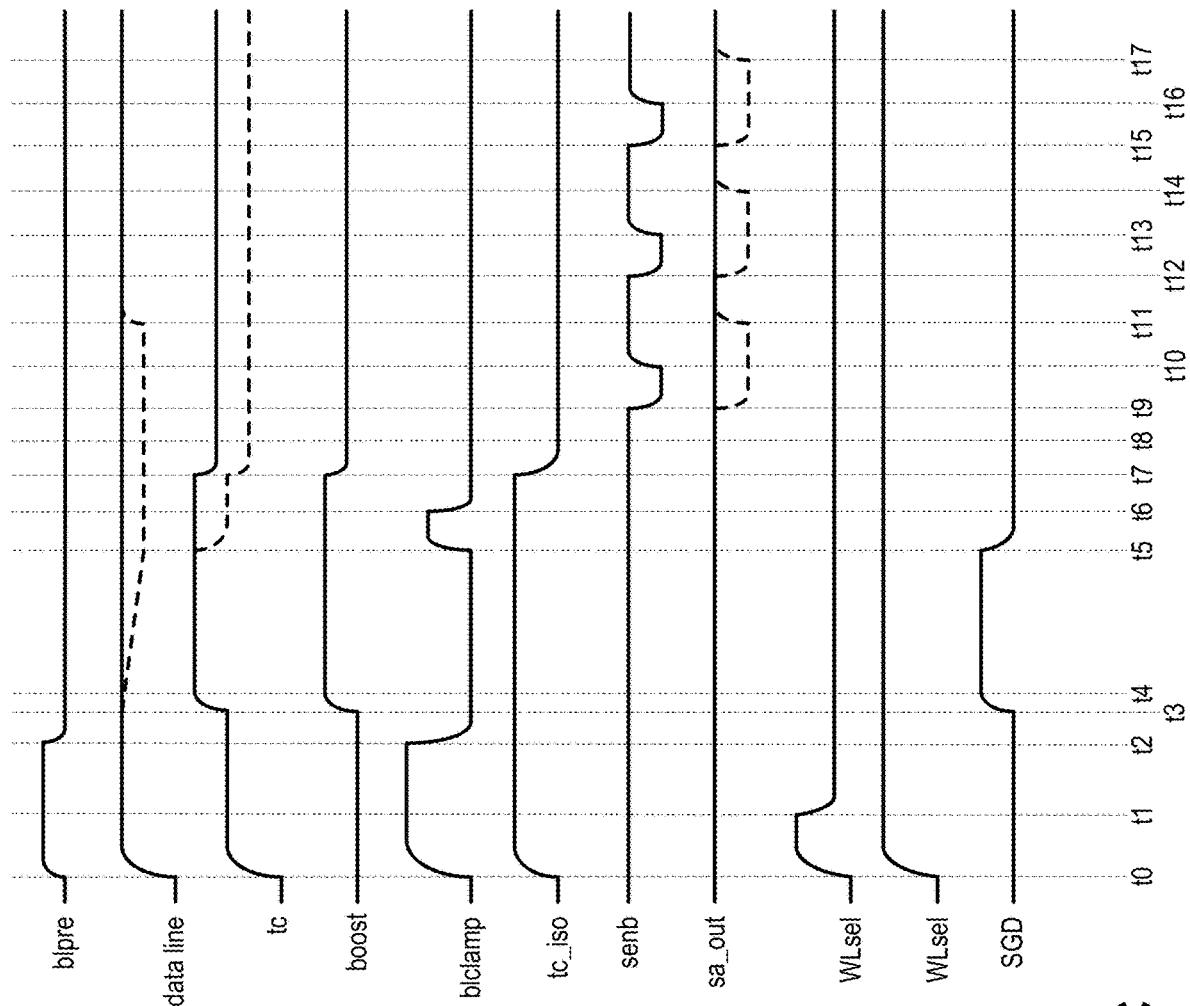

FIG. 10C is a timing diagram generally depicting voltage levels of various nodes of a sense circuit such as the sense circuit 300 depicted in FIG. 3 at various stages of a sense operation (e.g., read operation) in accordance with an embodiment. FIG. 10C is a variation of performing a sense operation such as depicted in FIG. 10A that strobes the sense circuit multiple times in response to a single sense operation. Such an embodiment might address variations of threshold voltage of a sense transistor, e.g., without addressing variations of threshold voltage of a memory cell, as the sense node tc might not be reconnected to the data line 204 between strobes. The description of FIG. 10A for times t0 to t11 might further generally describe times t0 to t11 of FIG. 10C. However, the strobing of the sense transistor 350 and loading of the register 380 from time t9 to time t11, respectively might be repeated from time t12 to time t14 of FIG. 10C, and from time t15 to time t17 of FIG. 10C. The process of times t9 to time t11 might be repeated as desired.

Figure 11:
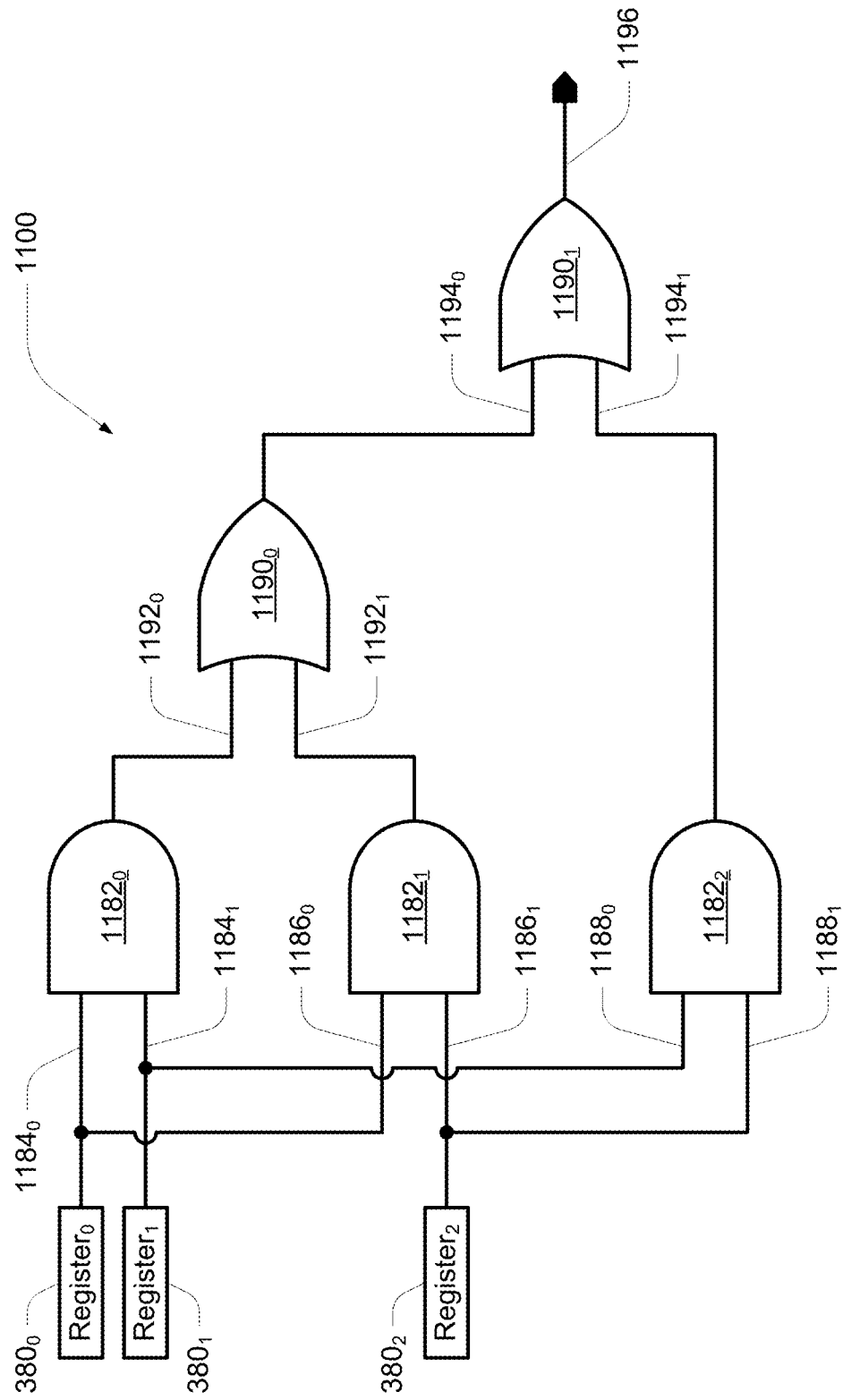
FIG. 11 is a block schematic of combinational logic that might be used with embodiments.

FIG. 11 depicts combinational logic circuit 1100 that might be used to determine a data value occurring in a majority of registers 380, e.g., where R=2. The combinational logic circuit 1100 might include a first AND gate $1182_0$ having a first input $1184_0$ connected to a first register $380_0$ and a second input $1184_1$ connected to a second register $380_1$. The combinational logic circuit 1100 might further include a second AND gate $1182_1$ having a first input $1186_0$ connected to the first register $380_0$ and a second input $1186_1$ connected to a third register $380_2$. The combinational logic circuit 1100 might further include a third AND gate $1182_2$ having a first input $1188_0$ connected to the second register $380_1$ and a second input $1188_1$ connected to the third register $380_2$.

The combinational logic circuit 1100 might further include a first OR gate $1190_0$ having a first input $1192_0$ connected to an output of the first AND gate $1182_0$ and a second input $1192_1$ connected to an output of the second AND gate $1182_1$. The combinational logic circuit 1100 might further include a second OR gate $1190_1$ having a first input $1194_0$ connected to an output of the first OR gate $1190_0$ and a second input $1194_1$ connected to an output of the third AND gate $1182_2$. The second OR gate $1190_1$ might have an output 1196 representative of the data value of the combined data of the registers $380_0$-$380_2$. Other combination logic could be constructed for determining what data value occurs in a majority of the registers 380 for the same or additional numbers of registers 380 whose data values are to be combined.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of memory cells; and
a controller for access of the array of memory cells, wherein the controller is configured to cause the apparatus to:
apply a sense voltage level to a control gate of a memory cell of the array of memory cells;
generate N determinations whether the memory cell is deemed to activate or deactivate while applying the sense voltage level, wherein N is an integer value greater than or equal to three;
deem the memory cell to have a threshold voltage in a first range of threshold voltages lower than the sense voltage level in response to a majority of the N determinations indicating activation of the memory cell; and
deem the memory cell to have a threshold voltage in a second range of threshold voltages higher than the sense voltage level in response to a majority of the N determinations indicating deactivation of the memory cell.

2. The apparatus of claim 1, wherein the controller being configured to cause the apparatus to generate N determinations whether the memory cell is deemed to activate or deactivate while applying the sense voltage level comprises the controller being configured to cause the apparatus to perform N sense operations on the memory cell.

3. The apparatus of claim 2, wherein the controller being configured to cause the apparatus to perform N sense operations on the memory cell comprises the controller being configured to cause the apparatus to perform N sense operations on the memory cell without discharging the control gate of the memory cell between sense operations of the N sense operations.

4. The apparatus of claim 1, wherein the controller being configured to cause the apparatus to generate N determinations whether the memory cell is deemed to activate or deactivate while applying the sense voltage level comprises the controller being configured to strobe a sense circuit N times, wherein the sense circuit has a sense node selectively connected to a data line that is selectively connected to the memory cell.

5. The apparatus of claim 4, wherein the controller being configured to strobe a sense circuit N times comprises the controller being configured to strobe a sense circuit N times without connecting the sense node to the data line between the strobes.

6. The apparatus of claim 1, wherein the controller being configured to cause the apparatus to deem the memory cell to have a threshold voltage in the first range of threshold voltages comprises the controller being configured to cause the apparatus to deem the memory cell to have a first data value.

7. The apparatus of claim 6, wherein the first data value consists of a single digit of data.

8. The apparatus of claim 6, wherein the controller being configured to cause the apparatus to deem the memory cell to have a threshold voltage in the second range of threshold voltages comprises the controller being configured to cause the apparatus to deem the memory cell to have a second data value different than the first data value.

9. The apparatus of claim 6, wherein the sense voltage level is a second sense voltage level, wherein the N determinations are a second N determinations, and wherein the controller is further configured to cause the apparatus to:
apply a first sense voltage level to the control gate of the memory cell prior to applying the second sense voltage level to the control gate of the memory cell, wherein the first sense voltage level is lower than the second sense voltage level;
generate a first N determinations whether the memory cell is deemed to activate or deactivate while applying the first sense voltage level;
deem the memory cell to have a second data value different than the first data value in response to a majority of the first N determinations indicating activation of the memory cell while applying the first sense voltage level or a majority of the second N determinations indicating deactivation of the memory cell while applying the second sense voltage level; and
deem the memory cell to have the first data value in response to a majority of the first N determinations indicating deactivation of the memory cell while applying the first sense voltage level and a majority of the second N determinations indicating activation of the memory cell while applying the second sense voltage level.

10. An apparatus, comprising:
an array of memory cells; and
a controller for access of the array of memory cells, wherein the controller is configured to cause the apparatus to:
sense a data state of a memory cell, of the array of memory cells, for N iterations to determine N instances of data, wherein N is an integer value greater than or equal to three, wherein each iteration of the N iterations corresponds to a respective instance of data of the N instances of data, and wherein the N instances of data each indicate a respective data value for the memory cell selected from a group consisting of a first data value, and a second data value different than the first data value; and
deem the data state of the memory cell to have the first data value in response to a majority of the N instances of data indicating the first data value for the memory cell.

11. The apparatus of claim 10, wherein the controller is further configured to cause the apparatus to deem the data state of the memory cell to have the second data value in response to a majority of the N instances of data indicating the second data value for the memory cell.

12. The apparatus of claim 10, wherein N is an odd integer.

13. The apparatus of claim 10, wherein the controller being configured to cause the apparatus to sense the data state of the memory cell for N iterations comprises the controller being configured to cause the apparatus to perform N sense operations on the memory cell.

14. The apparatus of claim 13, wherein the controller being configured to cause the apparatus to perform N sense operations on the memory cell comprises the controller being configured to cause the apparatus to perform N sense operations on the memory cell without discharging a control gate of the memory cell between sense operations.

15. An apparatus, comprising:
an array of memory cells; and a controller for access of the array of memory cells, wherein the controller is configured to cause the apparatus to:
 apply a sense voltage level to a respective control gate of each memory cell of a plurality of memory cells of the array of memory cells; and
 for each memory cell of the plurality of memory cells:
  generate N determinations whether that memory cell is deemed to activate or deactivate while applying the sense voltage level, wherein N is an integer value greater than or equal to three;
  deem that memory cell to have a threshold voltage in a first range of threshold voltages lower than the sense voltage level in response to a majority of the N determinations for that memory cell indicating activation of that memory cell; and
  deem that memory cell to have a threshold voltage in a second range of threshold voltages higher than the sense voltage level in response to a majority of the N determinations for that memory cell indicating deactivation of that memory cell.

16. The apparatus of claim 15, wherein the controller being configured to cause the apparatus to generate the N determinations for each memory cell of the plurality of memory cells comprises the controller being configured to cause the apparatus to generate the N determinations for each memory cell of the plurality of memory cells in response to a prior read operation of the plurality of memory cells resulting in an uncorrectable number of errors.

17. The apparatus of claim 15, wherein the controller being configured to cause the apparatus to deem any memory cell of the plurality of memory cells to have a threshold voltage in the first range of threshold voltages in response to a majority of the N determinations for that memory cell indicating activation of that memory cell comprises the controller being further configured to cause the apparatus to deem that memory cell to have a first data value, and wherein the controller being configured to cause the apparatus to deem that memory cell to have a threshold voltage in the second range of threshold voltages in response to a majority of the N determinations for that memory cell indicating deactivation of that memory cell comprises the controller being further configured to cause the apparatus to deem that memory cell to have a second data value different than the first data value.

18. The apparatus of claim 15, wherein the controller is further configured to cause the apparatus to:
 generate a combined set of data, wherein the combined set of data comprises a respective digit position for each memory cell of the plurality of memory cells, and wherein each digit position of the combined set of data has a data value equal to the data value its respective memory cell of the plurality of memory cells is deemed to have in response to a majority of its N determinations;
 perform error checking on the combined set of data;
 in response to an identification of no errors in the combined set of data, output the combined set of data; and
 in response to an identification of a correctable number of errors in the combined set of data, perform error correction on the combined set of data and output a corrected version of the combined set of data.

19. The apparatus of claim 18, wherein the sense voltage is a first sense voltage level, wherein the N determinations for each memory cell of the plurality of memory cells is a first N determinations for each memory cell of the plurality of memory cells, and wherein the controller, in response to an identification of an uncorrectable number of errors in the combined set of data, is further configured to cause the apparatus to:
 apply a second sense voltage level to the respective control gate of each memory cell of the plurality of memory cells, wherein the second sense voltage level is different than the first sense voltage level; and
 for each memory cell of the plurality of memory cells:
  generate a second N determinations whether that memory cell is deemed to activate or deactivate while applying the second sense voltage level;
  deem that memory cell to have a threshold voltage in the first range of threshold voltages in response to a majority of the second N determinations for that memory cell indicating activation of that memory cell; and
  deem that memory cell to have a threshold voltage in the second range of threshold voltages in response to a majority of the second N determinations for that memory cell indicating deactivation of that memory cell.

20. The apparatus of claim 18, wherein the controller, in response to an identification of an uncorrectable number of errors in the combined set of data, is further configured to cause the apparatus to indicate a failure condition.

* * * * *